(12) United States Patent
Werking

(10) Patent No.: US 7,619,549 B2
(45) Date of Patent: Nov. 17, 2009

(54) METHODS AND SYSTEMS FOR REDUCING A SIGN-BIT PULSE AT A VOLTAGE OUTPUT OF A SIGMA-DELTA DIGITAL-TO-ANALOG CONVERTER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 204 days.

(21) Appl. No.: 11/874,737

(22) Filed: Oct. 18, 2007

(65) Prior Publication Data

US 2009/0102690 A1 Apr. 23, 2009

(51) Int. Cl.
*H03M 3/00* (2006.01)
(52) U.S. Cl. .................................... 341/143; 341/152
(58) Field of Classification Search ............... 341/143, 341/152
See application file for complete search history.

(56) References Cited

U.S. PATENT DOCUMENTS

| | | | |
|---|---|---|---|
| 5,323,157 A | 6/1994 | Ledzius et al. | 341/143 |
| 5,764,171 A | 6/1998 | Stikvoort | 341/143 |
| 6,714,084 B2 | 3/2004 | Smith | 331/1 A |
| 2002/0084924 A1 | 7/2002 | Cusinato et al. | 341/143 |
| 2003/0151535 A1* | 8/2003 | Melanson et al. | 341/143 |
| 2005/0024248 A1 | 2/2005 | Koch | 341/143 |
| 2005/0219104 A1* | 10/2005 | Mallinson | 341/155 |

* cited by examiner

*Primary Examiner*—Howard Williams
(74) *Attorney, Agent, or Firm*—Shumaker & Sieffert, P.A.

(57) ABSTRACT

For a sigma-delta digital-to-analog converter (SD DAC) that includes a voltage output and a low-pass filter having a given order, methods and systems for reducing a sign-bit pulse at the voltage output of the SD DAC without requiring use of a higher order low-pass filter are disclosed. A method includes receiving a first waveform and a second waveform, the first and second waveforms having a first phase relationship; setting the first phase relationship between the first and second waveforms to a second phase relationship by aligning at least one of the first and second waveforms such that a transition of the second waveform is approximately half way between a rising edge and adjacent falling edge of the first waveform; upon setting the second phase relationship, multiplying the first and second waveforms to produce a digital input; and providing the digital input to the SD DAC.

20 Claims, 20 Drawing Sheets

| DELAY (ns) | DELAY (NO CYCLES) | AMPLITUDE (mV) |
|---|---|---|
| 150 | 0 | +98 |
| 350 | 1 | +49 |
| 550 | 2 | +3 |
| 750 | 3 | -45 |
| 950 | 4 | -99 |
| 1150 | 5 | -55 |
| 1350 | 6 | -4 |
| 1550 | 7 | +49 |

METHODS AND SYSTEMS FOR REDUCING A SIGN-BIT PULSE AT A VOLTAGE OUTPUT OF A SIGMA-DELTA DIGITAL-TO-ANALOG CONVERTER

GOVERNMENT RIGHTS

The United States Government has acquired certain rights in this invention pursuant to Contract No. DAAE30-01-9-0100 awarded by the US Army Tacom-ARDEC.

FIELD

The present invention relates generally to electronic circuitry and, more particularly, relates to sigma-delta digital-to-analog converters.

BACKGROUND

Sigma-Delta (SD) Digital-to-Analog Converters (DAC) operate to convert digital signals into analog signals, FIG. 1 is a block diagram of an SD DAC 100, according to an example. As shown, the SD DAC 100 includes a digital input 102, a digital translator 104, an analog low-pass filter (LPF) 106, and a voltage output 108.

The digital translator 104 typically operates to adjust logic levels received on the digital input 102. For example, the digital translator 104 may convert logic "1" levels on the digital input 102 to an ideally precise positive reference voltage of $+V_R$ and convert logic "0" or "−1" levels to an ideally precise negative reference voltage of $-V_R$, Relative to ground, the magnitude of $-V_R$ may be equal to the magnitude of $+V_R$.

The adjusted logic level is then applied to the LPF 106. The LPF 106 may be of a given order (e.g., $1^{st}$ order, $2^{nd}$ order, or $3^{rd}$ order) and usually includes a cut-off frequency, $f_0$. As shown in FIG. 1, the output of the LPF 106 includes the voltage output 108. An average baseband component of the voltage output 108 may be described by the following equation:

$$V_{OUT}=2d(DIN)V_R-V_R$$

In the above equation, "d" represents the density of ones or equivalent duty cycle of the digital input 102. Note that the voltage output 108 is equal to $+V_R$ when d equals "1", equal to $-V_R$ when d equals "0", and equal to zero when d equals "½".

Generally, the bandwidth of the SD DAC 100 output signal includes a maximum frequency component, $f_{MAX}$. Further, the digital input 102 to the SD DAC 100 may be clocked by a digital clock (or more than one digital clock) so that this data changes at a digital-clock frequency, or sampling signal frequency, of $f_S$. The ratio of the digital sampling frequency, $f_S$, to the Nyquist frequency of the highest frequency component of the analog output signal may be referred to as an oversampling ratio (OSR).

For proper operation of the SD DAC 100, certain frequency relationships must be maintained. For example, it is usually necessary for the cut-off frequency of the LPF, $f_0$, to be greater than the maximum signal frequency, $f_{MAX}$. Additionally, the cut-off frequency, $f_0$, must usually be much less than the digital-clock frequency, $f_S$, divided by the oversampling ratio, OSR. The following equation may describe the required relationships between the frequencies:

$$f_{MAX} < f_0 << f_S/(2*OSR)$$

The oversampling ratio, OSR, may provide an indication as to the accuracy of the SD DAC 100. The indication of the accuracy of the SD DAC 100 may also be expressed in terms of the number of binary or DAC bits, n, as $½^n$. The relationship between the cut-off frequency, $f_0$, and the number of binary bits may be described by:

$$f_0 << f_S/2^{(n+1)}$$

As the frequency margin between $f_S/2^{(n+1)}$ and $f_0$ increases, the SD DAC 100 operates more accurately. For example, $f_S/2^{(n+1)}$ is typically several orders of magnitude greater than the cut-off frequency, $f_0$, to minimize quantization noise during operation of the SD DAC 100. On the other hand, as the frequency margin between $f_S/2^{(n+1)}$ and Co increases, the SD DAC 100 operates with less signal bandwidth, thus decreasing overall performance of the SD DAC 100. At times, it may be desirable to increase the signal bandwidth of the SD DAC 100, even though doing so decreases the frequency margin between $f_S/2^{(n+1)}$ and $f_0$.

SUMMARY

As the frequency margin between $f_S/2^{(n+1)}$ and $f_0$ decreases, unwanted secondary effects may occur during operation of the SD DAC 100. One such effect is called a "sign-bit pulse," For an SD DAC that includes a voltage output and an LPF having a given order, methods and systems for reducing a sign-bit pulse at the voltage output of the SD DAC without requiring use of a higher order LPF are disclosed.

In one aspect, an embodiment of the present invention may take the form of a method. The method includes receiving a first waveform and a second waveform, the first and second waveforms having a first phase relationship. The first waveform may include a plurality of rising edges and falling edges. The method further includes setting the first phase relationship between the first and second waveforms to a second phase relationships Setting the first phase relationship to the second phase relationship may include aligning at least one of the first and second waveforms such that a transition of the second waveform is approximately half way between a rising edge and adjacent falling edge of the first waveform. The method also includes, upon setting the second phase relationship between the first and second waveforms, multiplying the first and second waveforms to produce a digital input. And the method also includes providing the digital input to the sigma-delta digital-to-analog converter.

In an example, the first waveform may include a square waveform and the second waveform function may include a signum function. In another example, the first and second waveforms having the first phase relationship includes the first and second waveforms being in phase with one another.

In some examples, setting the first phase relationship between the first and second waveforms to the second phase relationship includes adjusting at least one of the first and second waveforms such that the first and second waveforms are out of phase by approximately 90° plus or minus an integer multiple of 180°. In other examples, setting the first phase relationship to the second phase relationship includes adjusting at least one of the first and second waveforms such that the first and second waveforms are one-fourth of a data cycle out of phase from one another.

In an example, receiving the first and second waveforms includes providing the first waveform to a first flip-flop to produce a first output and providing the second waveform to a second flip-flop to produce a second output. The first flip-flop may be clocked by a first clock signal and the second flip-flop may be clocked by a second clock signal. Preferably, a period of the first clock signal is equal to a period of the second clock signal and the first clock signal is preferably in phase with the second clock signal. In some instances, the first clock signal includes the second clock signal.

In other examples, setting the first phase relationship between the first and second waveforms to the second phase relationship includes providing the second output to a third flip-flop to produce a third output. The third flip-flop may be clocked by a third clock signal. Preferably, a period of the third clock signal is equal to the period of at least one of the first clock signal and second clock signal, and the third clock signal is preferably out of phase with at least one of the first clock signal and second clock signal. In an example, the third clock signal is approximately 90° out of phase with at least one of the first clock signal and second clock signal. In another example, the third clock signal is produced by inverting one of the first clock signal and second clock signal.

In one instance, multiplying the first and second waveforms includes multiplying the first output and the third output to produce a fourth output. In an example, multiplying the first output and the third output includes taking the exclusive-OR of the first output and third output.

In an example, providing the digital input to the SD DAC includes providing the fourth output to a fourth flip-flop that produces the digital input. The fourth flip-flop may be clocked by a fourth clock signal that is in phase with at least one of the first clock signal and second clock signal. The frequency of the fourth clock signal may be approximately twice the frequency of at least one of the first clock signal and second clock signal.

In some examples, the fourth clock signal is produced by delaying the first clock signal to produce a delayed first clock signal, and taking the exclusive-OR of the first clock signal and the delayed first clock signal. In other examples, the fourth clock signal is produced by delaying the second clock signal to produce a delayed second clock signal, and taking the exclusive-OR of the second clock signal and the delayed second clock signal.

In one instance, delaying the first or second clock signal includes providing the first or second clock signal to a series of one or more pairs of inverters and/or a resistor-inductor-capacitor (RLC) network.

In another aspect, an embodiment of the present invention may take the form of a system. The system includes a multiplier that is arranged to receive a first waveform and a second waveform, the first and second waveforms having a first phase relationship. The first waveform may include a plurality of rising edges and falling edges. The multiplier is also arranged to set the first phase relationship between the first and second waveforms to a second phase relationship. The multiplier may align at least one of the first and second waveforms such that a transition of the second waveform is approximately half way between a rising edge and adjacent falling edge of the first waveform. The multiplier is further arranged to, upon setting the second phase relationship between the first and second waveforms, multiply the first and second waveforms to produce a digital input. And the multiplier is also arranged to provide the digital input to an SD DAC.

In some examples, the first waveform includes a square waveform and the second waveform includes a signum function. In one example, the multiplier adjusts at least one of the first and second waveforms such that the first and second waveforms are out of phase by approximately 90° plus or minus an integer multiple of 180°. In another example, the multiplier adjusts at least one of the first and second waveforms such that the first and second waveforms are one-fourth of a data cycle out of phase from one another.

In yet another aspect, an embodiment of the present invention may take the form of another method. The method includes providing a first waveform and a second waveform such that a transition of the second waveform is aligned approximately half way between a rising edge and adjacent falling edge of the first waveform, multiplying the first and second waveforms to produce a digital input, and providing the digital input to the sigma-delta digital-to-analog converter.

In an example, a processor executing program instructions, which are stored in memory, provides the first and second waveforms such that a transition of the second waveform is aligned approximately half way between a rising edge and adjacent falling edge of the first waveform.

These as well as other aspects and advantages will become apparent to those of ordinary skill in the arm by reading the following detailed description, with appropriate reference to the accompanying drawings.

BRIEF DESCRIPTION OF THE DRAWINGS

Various embodiments are described herein with reference to the following drawings, wherein like numerals denote like entities.

DETAILED DESCRIPTION

1. Brief Explanation of a Sign-Bit Pulse

As noted, to improve overall performance of an SD DAC, one may increase the signal bandwidth, $f_{MAX}$, of the SD DAC. But increasing the signal bandwidth of the SD DAC typically decreases the frequency margin between $f_S/2^{(n+1)}$ and $f_0$. And as the frequency margin between $f_S/2^{(n+1)}$ and $f_0$ decreases, unexpected secondary effects, such as the sign-bit pulse, may result.

Figure 1:
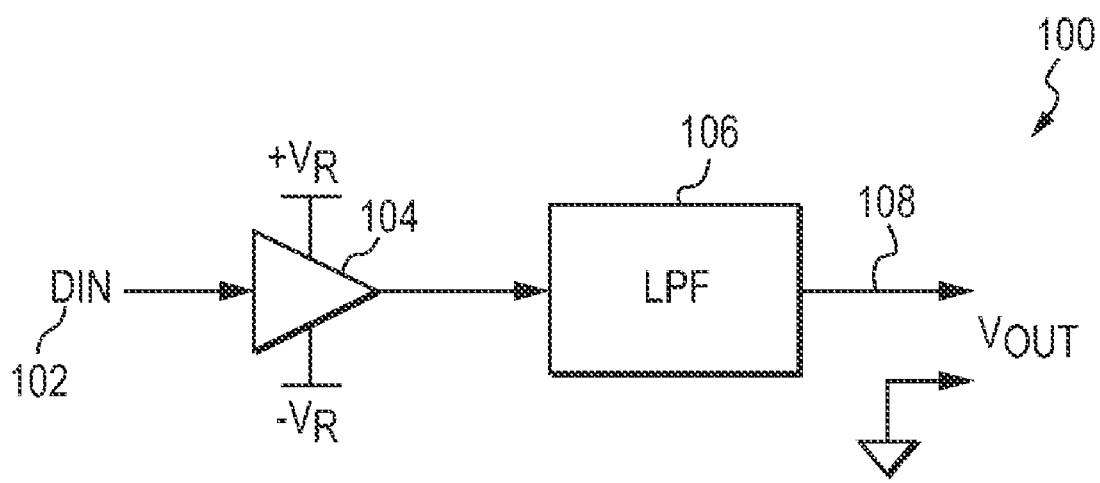
FIG. 1 is a block diagram of an SD DAC, according to an example.
Figure 2:
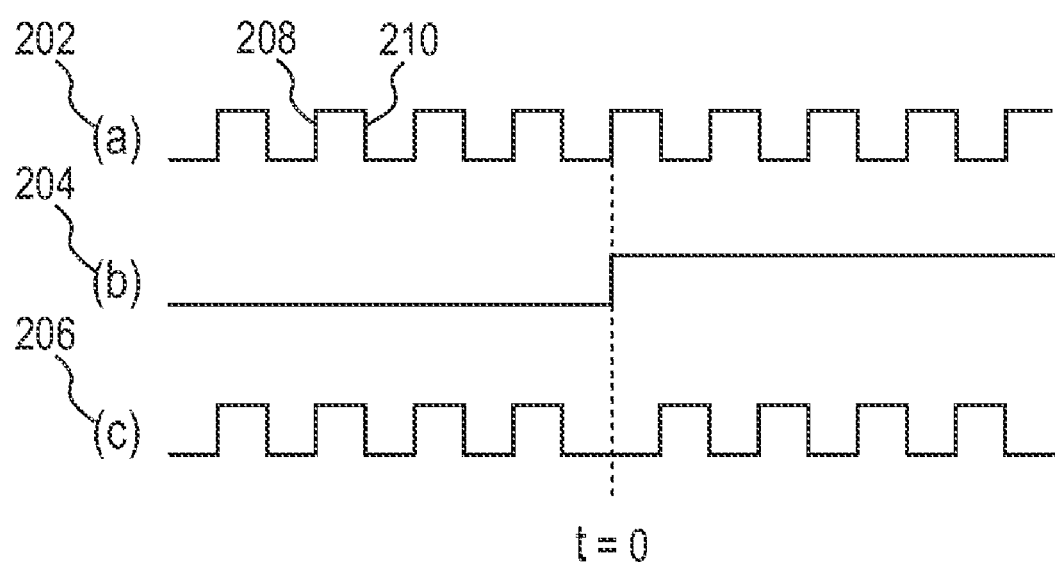
FIG. 2 includes plots of various waveforms, according to examples.

To illustrate, FIG. 2 includes plots of a data waveform 202 (or first waveform), a signum function 204 (or second waveform), and a digital waveform 206. As shown in FIG. 2, the data waveform 202 is a square waveform, which may be formed by alternating data at every rising or falling clock edge, for instance. In this example, the frequency of the data waveform 202 is one-half of the frequency of the digital-clock frequency, $f_S$. As depicted, the data waveform 202 includes a plurality of rising edges such as rising edge 208 and a plurality of falling edges such as falling edge 210. As the data waveform 202 is a digital signal, it may assume one of two states such as +1 and −1. Further, since the data waveform 202 is a square waveform in this case, "d" for the data waveform 202 is equal to "½". Hence, when the data waveform 202 is applied the digital input 102 of the SD DAC 100, the voltage output 108 of the SD DAC 100 is zero. Of course, other examples exist for the data waveform 202. For example, the frequency and/or duty cycle of the data waveform 202 may vary, and the data waveform 202 may be a waveform other than a square waveform. The signum function 204 (or unit-step function or sign function) is a digital signal and thus assumes one of two states such as +1 and −1. As shown, the signum function 204 is equal to "−1" before t=0 and equal to "+1" after t=0. When the signum function 204 is applied to the digital input 102 of the SD DAC 100, the voltage output 108 swings from $-V_R$ to $+V_R$ in a time period determined by the LPF 106. If the SD DAC 100 includes higher order LPFs (e.g., $2^{nd}$ order or $3^{rd}$ order), then the voltage output 108 may exhibit ringing before settling to a final value. Further details regarding signum functions can be found in Clare D. McGillem and George R. Cooper, *Continuous and Discrete Signal and System Analysis*, Holt, Rinehart and Winston, 1971, which is hereby incorporated by reference in its entirety. Of course, other examples exist for the signum function 204.

The data waveform 202 and signum function 204 may be clocked by the same clock signal or by different clock signals. If different clock signals are used to clock the data waveform 202 and signum function 204, the period of each of the two clock signals is preferably equal to one another and the two clock signals are preferably in phase with one another.

As shown in FIG. 2, the data waveform 202 and signum function 204 each make a positive transition at t=0. As such, the data waveform 202 and signum function 204 are in phase with one another.

The digital waveform 206 may be formed by multiplying the data waveform 202 and signum function 204. When the data waveform 202 and signum function 204 each make a positive transition at t=0, the digital waveform 206 will take the form as shown in FIG. 2. Of course, the digital waveform 206 may take a different form if the data waveform 202 and signum function 204 have a different phase relationship (e.g., if one or more of the data waveform 202 and signum function 204 do not make a positive transition at t=0).

Figure 3:
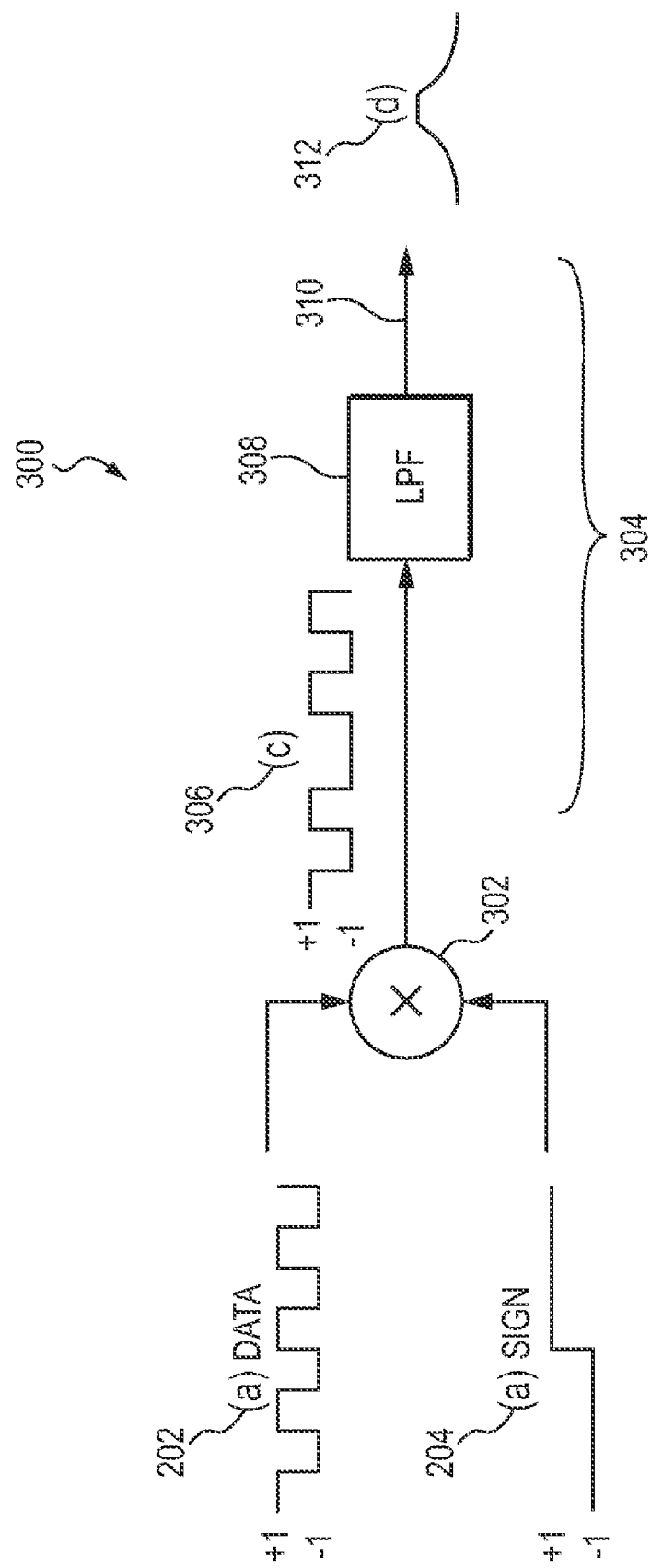
FIG. 3 is a block diagram of a circuit for use in producing a voltage output, according to an example.

FIG. 3 is a block diagram of a circuit 300 for use in producing a voltage output, according to an example. The circuit 300 includes a multiplier 302 and SD DAC 304. The multiplier 302 receives the data waveform 202 and signum function 204 as inputs, and produces a digital waveform 306 as an output. As shown, if the data waveform 202 and signum function 204 each make a positive transition at t=0, then the digital waveform 306 is substantially similar to the digital waveform 206. Of course, if the data waveform 202 and signum function 204 have a different phase relationship, then the digital waveform 306 may take a different form.

The multiplier 302 may be used to combine the data waveform 202 (i.e., magnitude data) and signum function (i.e., sign data) before applying a digital input to the SD DAC 304. The multiplier 302 may combine the data waveform 202 and signum function 204 in any of a variety of ways. In this example, the multiplier 302 takes the exclusive-OR of the data waveform 202 and signum function 204.

Any combination of hardware, software, and firmware may be used to implement the multiplier 302. As an example, a processor (e.g., DSP) may execute program instructions to combine the data waveform 202 and signum function 204. As another example, the multiplier 302 may include one or more logic gates that receive the data waveform 202 and signum function 204 as inputs and take the exclusive-OR of the data waveform 202 and signum function 204. Of course, other examples exist for the multiplier 302.

The SD DAC 304 includes a digital translator (not shown in FIG. 3), LPF 308, and voltage output 310. The digital translator receives the output of the multiplier 302 (ibex, the digital input) and provides a digital signal to the LPF 308, which produces the voltage output 310. In the example where the digital waveform 306 is substantially similar to the digital waveform 206 (e.g., when the data waveform 202 and signum function 204 each make a positive transition at t=0), the voltage output 310 includes an analog pulse 312 (not drawn to scale).

Figure 4:
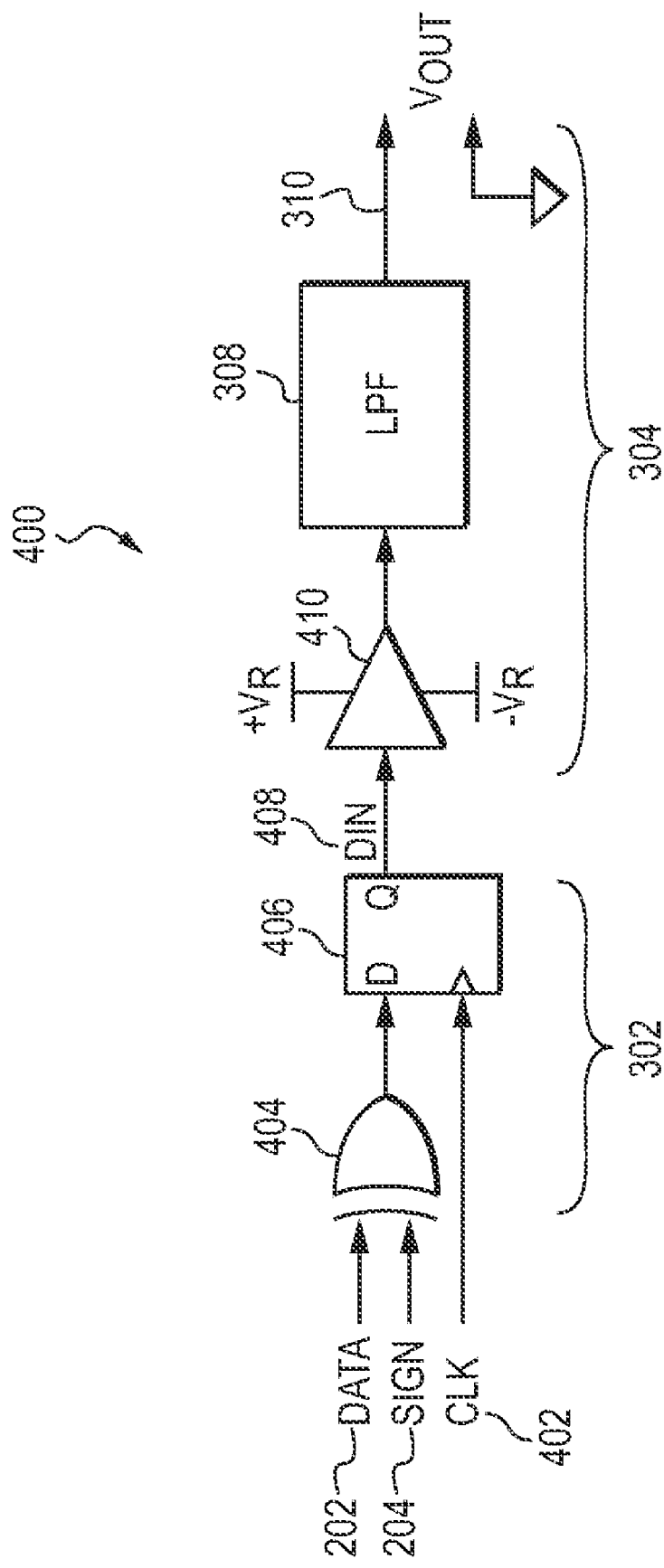
FIG. 4 is a block diagram of a circuit for use in producing a voltage output, according to an example.

FIG. 4 is a block diagram of a circuit 400 for use in producing a voltage output, according to an example. The circuit 400 may be an embodiment of the circuit 300. As shown, the circuit 400 includes the multiplier 302 and SD DAC 304. The SD DAC 302 includes a digital input 408, a digital translator 410, the LPF 308, and the voltage output 310. And the multiplier 302 includes an exclusive-OR gate 404 and flip-flop 406 (e.g., D flip flop, SR flip flop, T flip flop, and JK flip flop). The exclusive-OR gate 404 receives as inputs the data waveform 202, signum function 204, and clock signal 402. In this example, the frequency of the clock signal 402 is $f_S$, and the maximum frequency of the data waveform 202 is one-half of the clock or sample frequency, $f_S$. Of course, other examples exist for the frequency of the clock signal 402 and the frequency of the data waveform 202.

Since the data waveform 202 and signum function 204 are each digital signals, the output of the flip-flop 406 (i.e., digital input 408) is also digital and assumes one of two states such as +1 and −1. And since the data waveform 202 and signum function 204 each make a positive transition at t=0 in this case, the digital input 408 includes a waveform that is substantially similar to the digital waveforms 206 and 306.

Referring to FIG. 2, note that the duty cycle of the digital waveform 206 is approximately one-half (d=½) both before and after t=0. But at t=0 there is a slight discontinuity that is one clock cycle long. When the digital input 408 includes the digital waveform 206, one might expect that the voltage output 310 of the SD DAC 304 to equal zero both before and after t=0 and that there would be little, if any, response to the discontinuity at t=0, since ½ $f_S$>>$f_S/2^{(n+1)}$>>$f_0$. At most, one would expect a short pulse having a magnitude of less than one "count" or $2V_R/2^{(n+1)}=V_R/2^n$.

But this is not necessarily the case. In simulations of the circuit 400 in which the digital input 408 included the digital waveform 206, the analog pulse 312 of the voltage output 310 included a sign-bit pulse with a relatively significant amplitude. Any of a variety of systems may be used to simulate the circuit 400. In this example, a High Performance Accelerometer, revision 2 ("HPA2") system was used.

Figure 5:
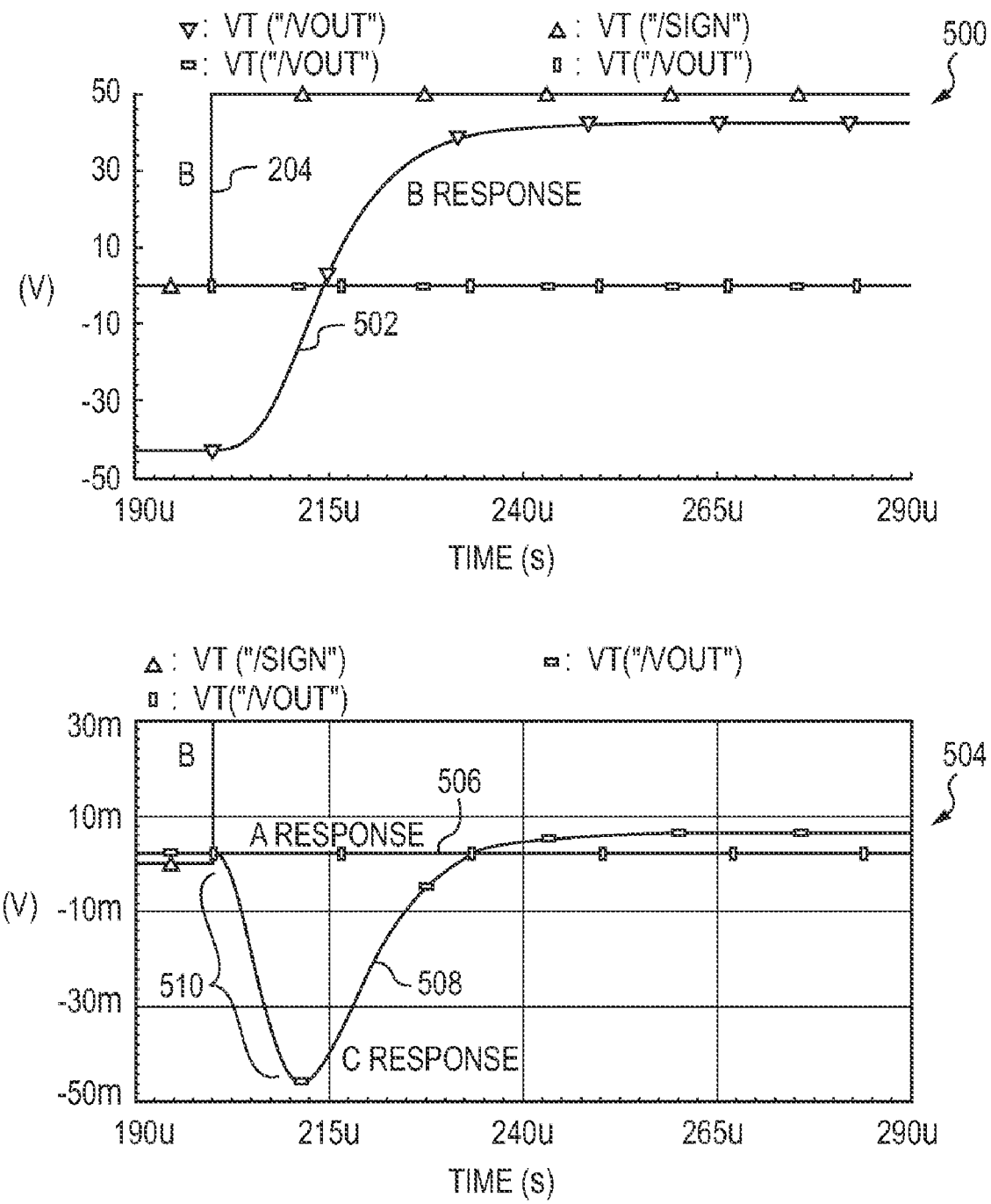
FIG. 5 includes graphs that depict simulations of the system shown in FIG. 4, according to examples.
Figure 6A:
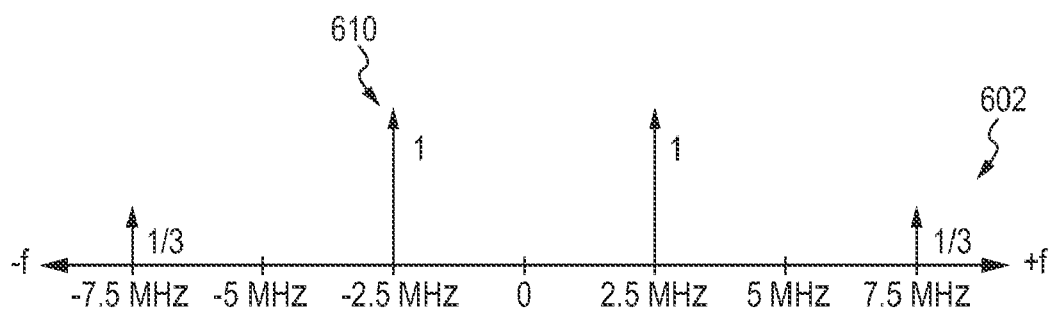
FIG. 6 includes graphs in the frequency domain, according to examples.
Figure 6B:
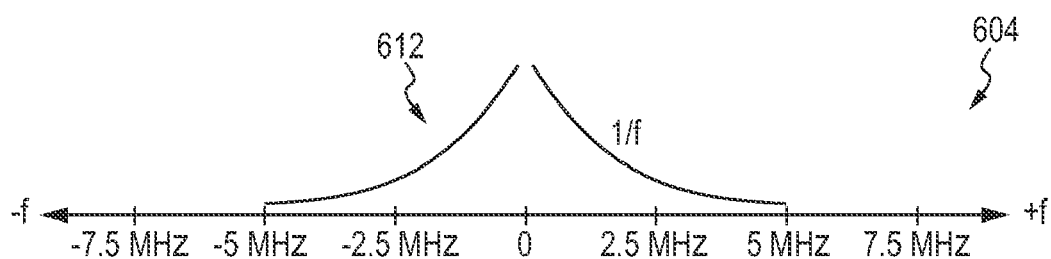
Figure 6C:
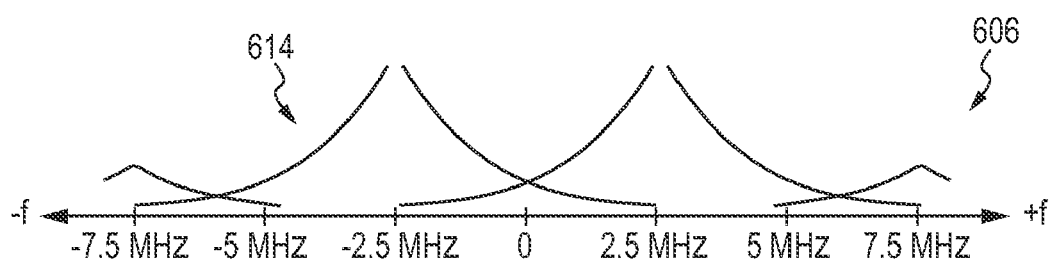
Figure 6D:
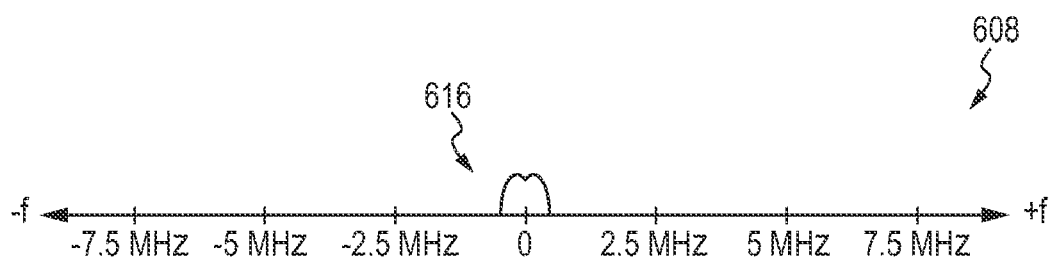

FIG. 5 includes graphs 500 and 504 that depict simulations of the HPA2 system. These graphs were produced by a series of three Spectre simulations of the circuit 400. The digital-clock frequency for the HPA2 system was equal to 5 MHz, and the time between successive edges in the data waveform 202 is therefore 200 ns. To allow the simulation to initialize properly, the transition of the signum function 204 was placed at t=200 us, rather than t=0 (the phase relationship between the data waveform 202 and signum function 204 was unaltered). Other than the displacement of the transition of the signum function 204, the waveforms 202,204,206 applied to the HPA2 system were substantially the same as those shown in FIG. 2.

The graph 500 includes a plot of the signum function 204 and a plot 502 of the voltage output 310 of the SD DAC 304 when the digital input 408 includes the signum function 204. The graph 504 depicts the graph 502 at a magnified voltage scale. As shown, the graph 504 includes plots 506 and 508. The plot 506 is the voltage output 310 of the SD DAC 304 when the digital input 408 includes the data waveform 202, and the plot 508 is the voltage output 310 of the SD DAC 304 when the digital input 408 includes the digital waveform 206 or 306 (i.e., the plot 508 includes the analog pulse 312). As expected, the plot 506 is zero, because "d" equals one-half for the data waveform 202. But the plot 508 includes a sign-bit pulse 510. Note that the peak amplitude of the sign-bit pulse 510 is 47.9 mV below the steady state of the voltage output 506. And 47.9 mV is equivalent to approximately 897 counts, where one count in this system is equal to about 53.4 uV ($3.5V/2^{16}$). The sign-bit pulse 510 is significantly greater than one would intuitively expect. Such a sign-bit pulse could lead to significant problems in many systems such as the HPA2 system.

Hence, it is desirable to reduce such a sign-bit pulse. To reduce the sign-bit pulse, one may either use higher order LPFs or increase the digital-clock frequency, $f_S$. Unfortunately, both of these solutions have adverse economic consequences. As examples, higher-order LPFs require significant increases in chip area, and faster digital clocks require faster digital multipliers, which in turn require finer lithography. This disclosure presents relatively economical methods and systems for reducing a sign-bit pulse at a voltage output of an SD DAC.

2. Theoretical and Experimental Explanations for a Sign-Bit Pulse

As will be shown below, an amplitude of a sign-bit pulse is a function of the phase relationship between the data waveform 202 and signum function 204 before they are multiplied (e.g., by a processor executing program instructions or by an exclusive-OR gate). Hence, by setting or adjusting the phase relationship between the data waveform 202 and signum function 204 before they are multiplied, one may significantly, if not entirely, reduce the amplitude of the sign-bit pulse at the voltage output of an SD DAC.

To understand how this sign-bit pulse is generated, one may examine each of the data waveform 202, signum function 204, digital waveform 206 (or digital waveform formed by multiplying the data waveform 202 and signum function 204, more generally), and resulting voltage output 310 in the frequency domain. As will be shown below, the data waveform 202 may be described by one of two Fourier series depending on the "phase" of the data waveform 202 at t=0. The differences in these two spectra are described below.

FIG. 6 includes graphs 602,604,606,608 that are each in the frequency domain. Each of the graphs 602,604,606,608 depicts a double-sided spectrum. Graph 602 includes a plot 610 of the square wave data waveform 202 in the frequency domain when the data waveform 202 makes a positive transition at t=0; graph 604 includes a plot 612 of the signum function 204 when the signum function 204 makes a positive transition at t=0; graph 606 includes a plot 614 of the digital waveform 206 (or 306) in the frequency domain; and graph 608 includes a plot 616 of the voltage output 310 in the frequency domain corresponding to the output of the low pass filter 310. Put another way, the plot 616 corresponds to the plot 508 in the frequency domain.

If t=0 is defined as the point where the data waveform 202 and signum function 204 each make a positive transition, then the Fourier series of the data waveform 202 is described by the following equation:

$$4/\Pi \Sigma 1/(2n-1)\sin(2\Pi(2n-1)t/T)$$

The first and third harmonics of this series are shown by the plot 610. The power spectrum of the signum function 204 is shown by the plot 612, and follows the equation $$2/2\Pi f.$$

A multiplication of the data waveform 202 and signum function 204 in the time domain is the equivalent to a convolution of the data waveform 202 and signum function 204 in the frequency domain. A result of the convolution of plots 610 and 612 is shown by the plot 614, which represents a power spectrum of the digital waveform 206. Plot 616 represents a power spectrum of the voltage output 310 when the digital input 206 is filtered (not drawn to scale).

It should be noted that the plot 616 (i.e., the power spectrum of the plot 508) is not drawn to scale. The power spectrum of the plot 508 is approximately 18 kHz, which would result in a power spectrum that is about 26 times narrower than shown by the plot 616. It should further be noted that the power spectrum of the plot 508 does not include a DC component. This indicates that the plot 508 includes a sign-bit pulse with a positive amplitude that will eventually return to the same voltage at which it started.

Figure 7:
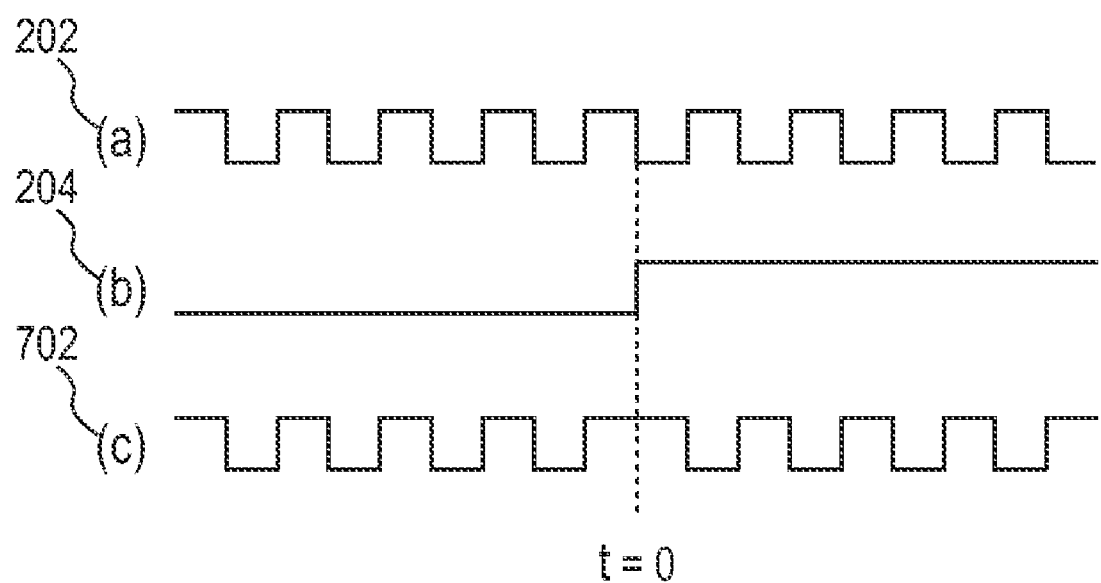
FIG. 7 includes plots of various waveforms, according to examples.
Figure 8A:
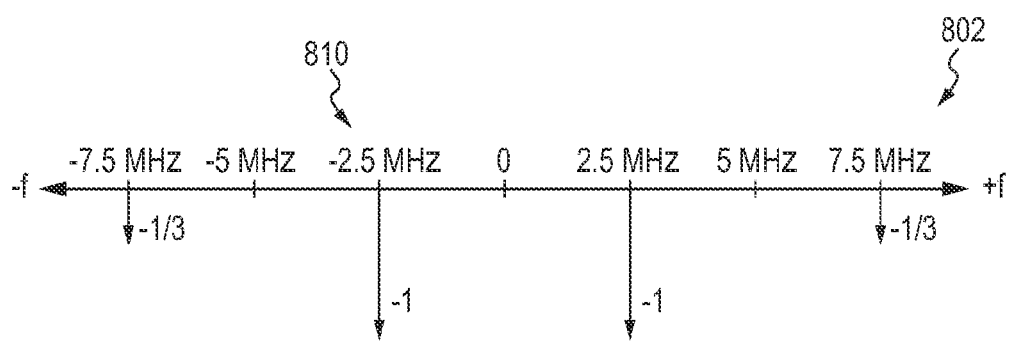
FIG. 8 includes graphs in the frequency domain, according to examples.
Figure 8B:
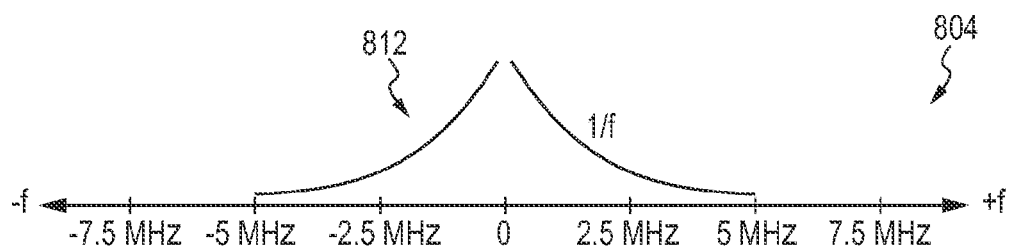
Figure 8C:
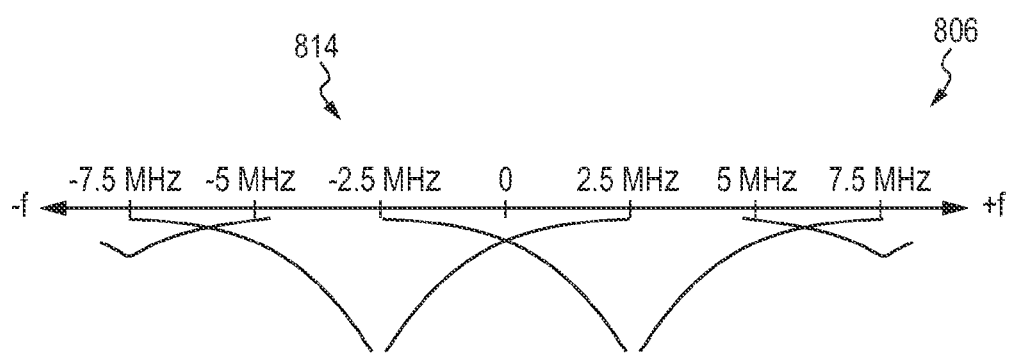
Figure 8D:
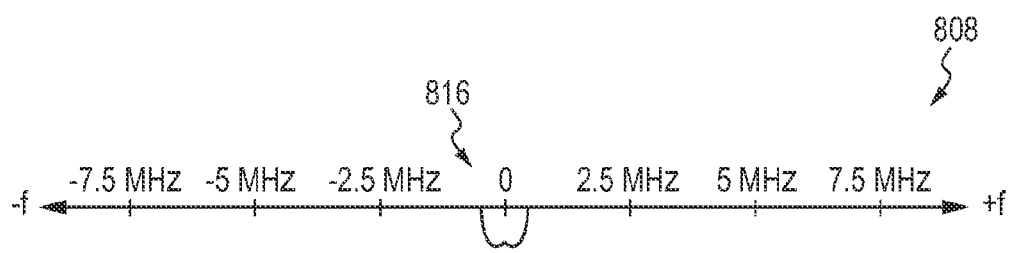

FIG. 7 includes plots of the data waveform 202, the signum function 204, and a digital waveform 702. In this example, the data waveform 202 is delayed by one clock cycle, or sample period, such that at t=0, the data waveform 202 makes a negative transition, while the signum function 204 makes a positive transition. Delaying the data waveform 202 in this manner is equivalent to inverting the data waveform 202. The digital waveform 702 is a result of a multiplication (e.g., by an exclusive-OR gate) of the delayed data waveform 202 and signum function 204.

FIG. 8 includes graphs 802,804,806,808 that are each in the frequency domain. Each of the graphs 802,804,806,808 depicts a double-sided spectrum. Graph 802 includes a plot 810 of the data waveform 202 in the frequency domain when the data waveform 202 makes a negative transition at t=0; graph 804 includes a plot 812 of the signum function 204 in the frequency domain when the signum function 204 makes a positive transition at t=0; graph 806 includes a plot 814 of the digital waveform 702 in the frequency domain; and graph 808 includes a plot 816 of the voltage output 310 in the frequency domain corresponding to when the digital input 408 includes the digital waveform 702.

As shown by the plot 810, the Fourier series expansion of the delayed data waveform 202 has a negative amplitude. Similar to the plot 612, the power spectrum of the signum function 204 is shown by the plot 812. Plot 814 shows a convolution of the plots 810 and 812, and plot 816 depicts a power spectrum of the voltage output 310 after the LPF when the digital input 408 includes the digital waveform 702. The power spectrum shown by plot 816 is the same as the power spectrum shown in plot 616, but the power spectrum shown by the plot 816 is negative. Hence, the voltage output 310 of the SD DAC 304 when the digital input 408 includes the digital waveform 702 is includes a negative pulse.

Figure 9:
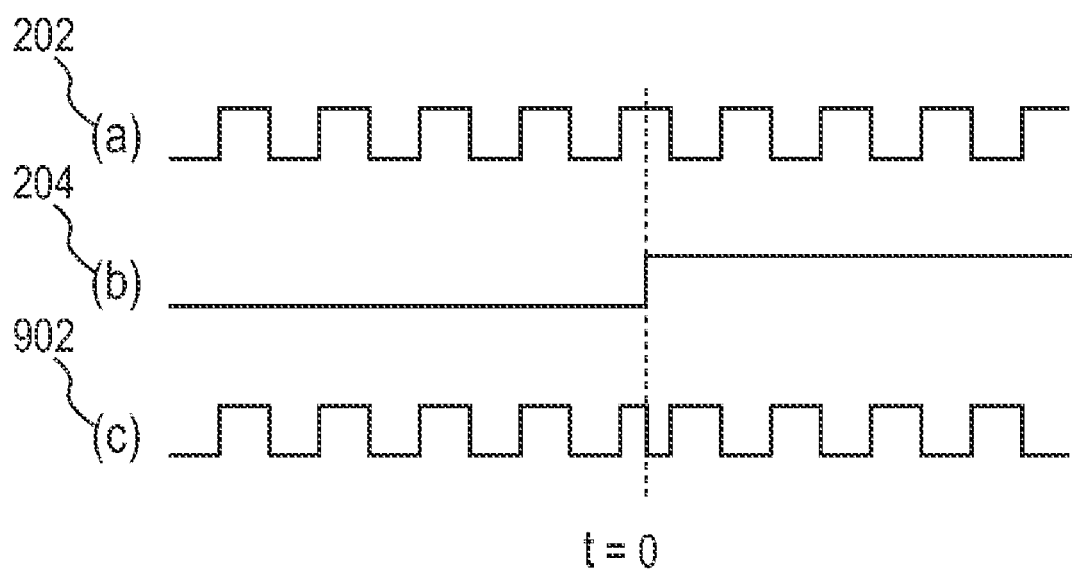
FIG. 9 includes plots of various waveforms, according to examples.
Figure 10A:
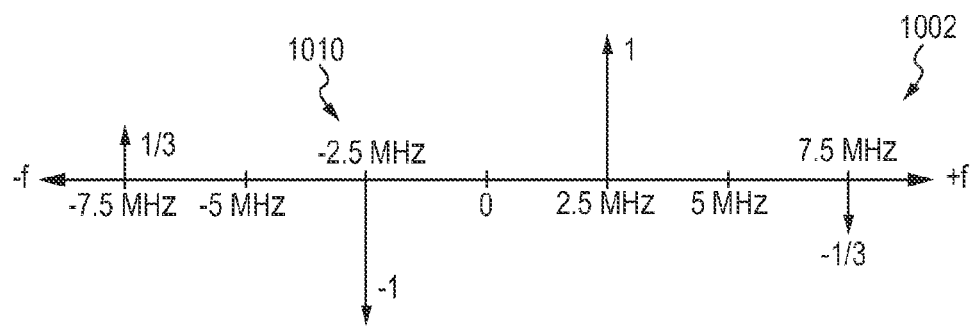
FIG. 10 includes graphs in the frequency domain, according to examples.
Figure 10B:
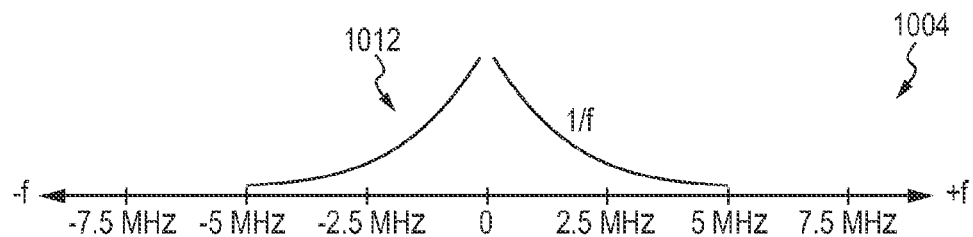
Figure 10C:
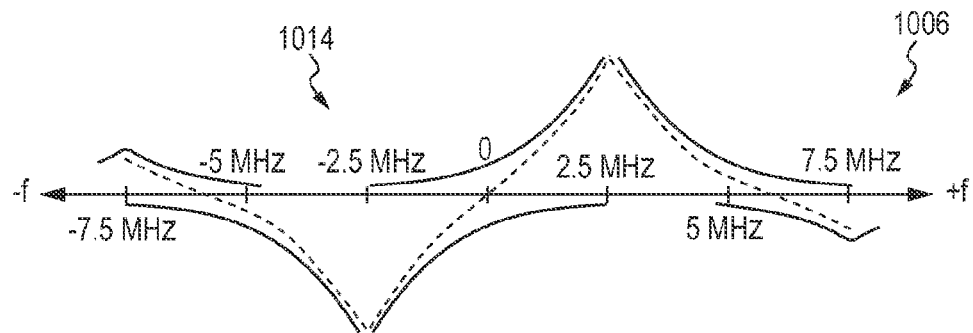
Figure 10D:
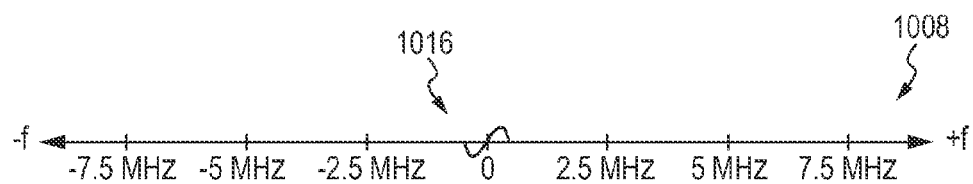

FIG. 9 includes plots of the data waveform 202, the signum function 204, and a digital waveform 902. In this example, the data waveform 202 is delayed by one-half of a clock cycle or one-fourth of the square wave period. Hence, at t=0, the signum function 204 makes a positive transition, and the transition of the signum function 204 is aligned approximately half way between a rising edge and consecutive falling edge of the data waveform 202. Put another way, the transition in the signum function 204 is aligned in the middle of a "1" or "−1" of the data waveform 202. The digital waveform 902 is a result of a multiplication of the quarter-data-cycle-delayed data waveform 202 and signum function 204.

FIG. 10 includes graphs 1002,1004,1006,1008 that are each in the frequency domain. Each of the graphs 1002,1004, 1006,1008 depicts a double-sided spectrum. Graph 1002 includes a plot 1010 of the quarter-data-cycle-delayed data waveform 202 in the frequency domain; graph 1004 includes a plot 1012 of the signum function 204 in the frequency domain when the signum function 204 makes a positive transition at t=0; graph 1006 includes a plot 1014 of the digital waveform 902 in the frequency domain; and graph 1008 includes a plot 1016 of the filtered voltage output 310 in the frequency domain corresponding to when the digital input 408 includes the digital waveform 902.

In this case, the Fourier series expansion of the quarter-data-cycle-delayed data waveform 202 changes. It is now described by the following equation:

$$4/\pi \Sigma (-1)^{n+1}/(2n-1)\sin(2\pi(2n-1)t/T)$$

As shown by the plot 1010, the sign of each harmonic now alternates. The power spectrum of the signum function 204 shown by plot 1012 is the same as shown by plots 612 and 812, but the convolution of plots 1010 and 1012, which is shown by plot 1014, is different. The overall result of the convolution of plots 1010 and 1012 is approximately shown by the dashed line 1018. Note that this spectrum has zero amplitude at f=0.

The power spectrum shown by plot 1016 may imply a small output pulse with a phase that is shifted by 90 degrees with that of the previous pulses. Hence, the amplitude of the spectrum shown by plot 1016 is relatively much less than the amplitude of the spectrum of either plot 616 or 816. If plotted to scale, the amplitude of the spectrum shown by plot 1016 would be about approximately 26 times smaller than the amplitude of the spectra of plots 616 and 816.

With this analysis in the frequency domain, one would expect that by adjusting the phase relationship between the data waveform 202 and signum function 204 such that the data waveform 202 and signum function 204 are out of phase by approximately 90° or one-fourth of a data cycle before multiplying the two waveforms, the amplitude of the sign-bit pulse at the voltage output 310 may be reduced by a factor of 26 or more.

Figure 11:
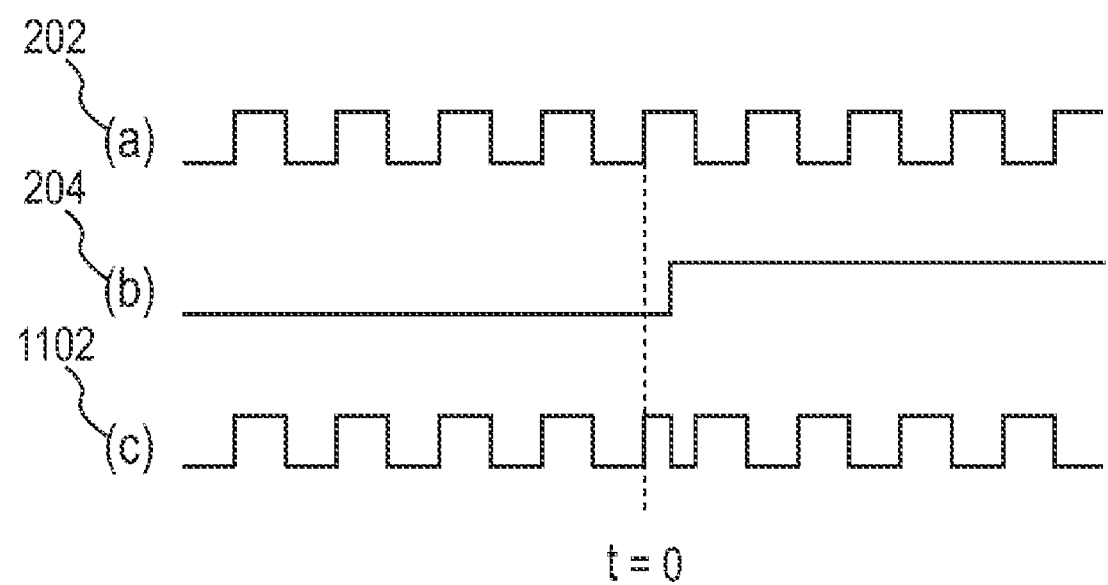
FIG. 11 includes plots of various waveforms, according to examples.

Of course, rather than adjusting or shifting the data waveform 202, the signum function 204 may be adjusted or shifted instead. For example, as shown in FIG. 11, the data waveform 202 makes a positive transition at t=0, while the signum function 204 is shifted by approximately 90° or one-fourth of a data cycle such that the signum function 204 makes a positive transition half way between a rising edge and consecutive falling edge of the data waveform 202. Put another way, a positive transition of the signum function 204 corresponds to a middle of a "1" or "−1" of the data waveform 202. The digital waveform 1102 is a result of a multiplication of the data waveform 202 and shifted signum function 204. The digital waveform 1102 is substantially similar to the digital waveform 902.

As another examples the data waveform 202 and signum function 204 may both be adjusted or shifted such that they are approximately 90° or one-fourth of a cycle out of phase from one another. As yet another example, rather than a positive transition, a negative transition of the signum function 204 may be aligned such that the negative transition of the signum function aligns half way between a rising edge and falling edge of the data waveform 202. Of course, other examples exist for adjusting or shifting the phase relationship between the data waveform 202 and signum function 204 such that the data waveform 202 and signum function 204 are out of phase by approximately 90° or one-fourth of a cycle before multiplying the two waveforms.

Figure 12:
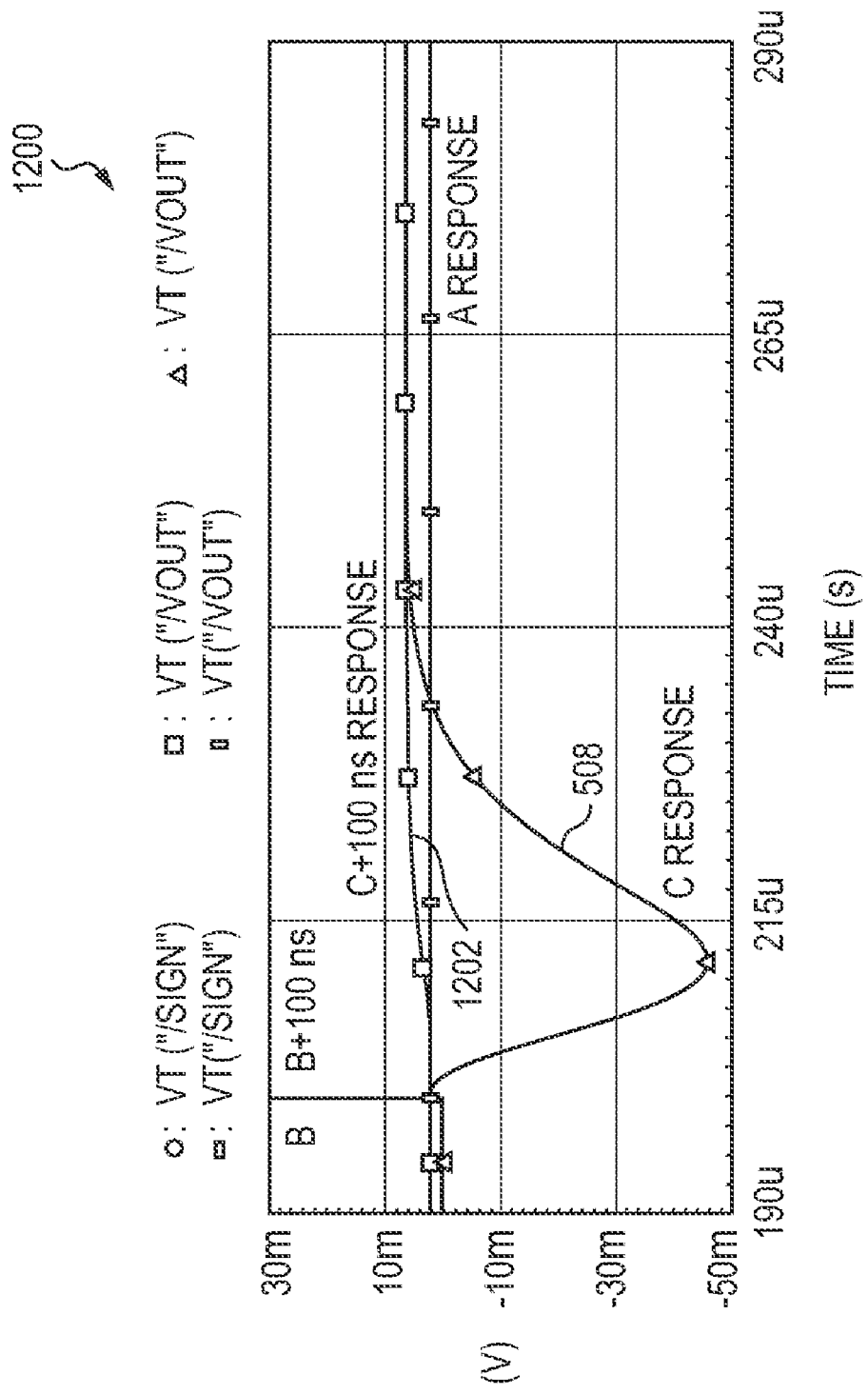
FIG. 12 is a graph that depicts simulations of an improved system, according to an example.

In the course of simulating this system, it was confirmed that the amplitude and sign of the resultant sign-bit pulse is a function of the phase relationship between the data waveform 202 and signum function 204. FIG. 12 is a graph 1200 that depicts simulations of the HPA2 system, according to an example. The plot 1202 corresponds to the voltage output 310 of the SD DAC 304 when the digital input 408 includes the digital waveform 902 or 1102. For purposes of comparison, the plot 508 is reproduced in the graph 1200 as well. Note that the peak amplitude of the plot 1202 is approximately 3.8 mV or 71 counts, which is significantly less than the 897 counts of the plot 508.

Figure 13A:
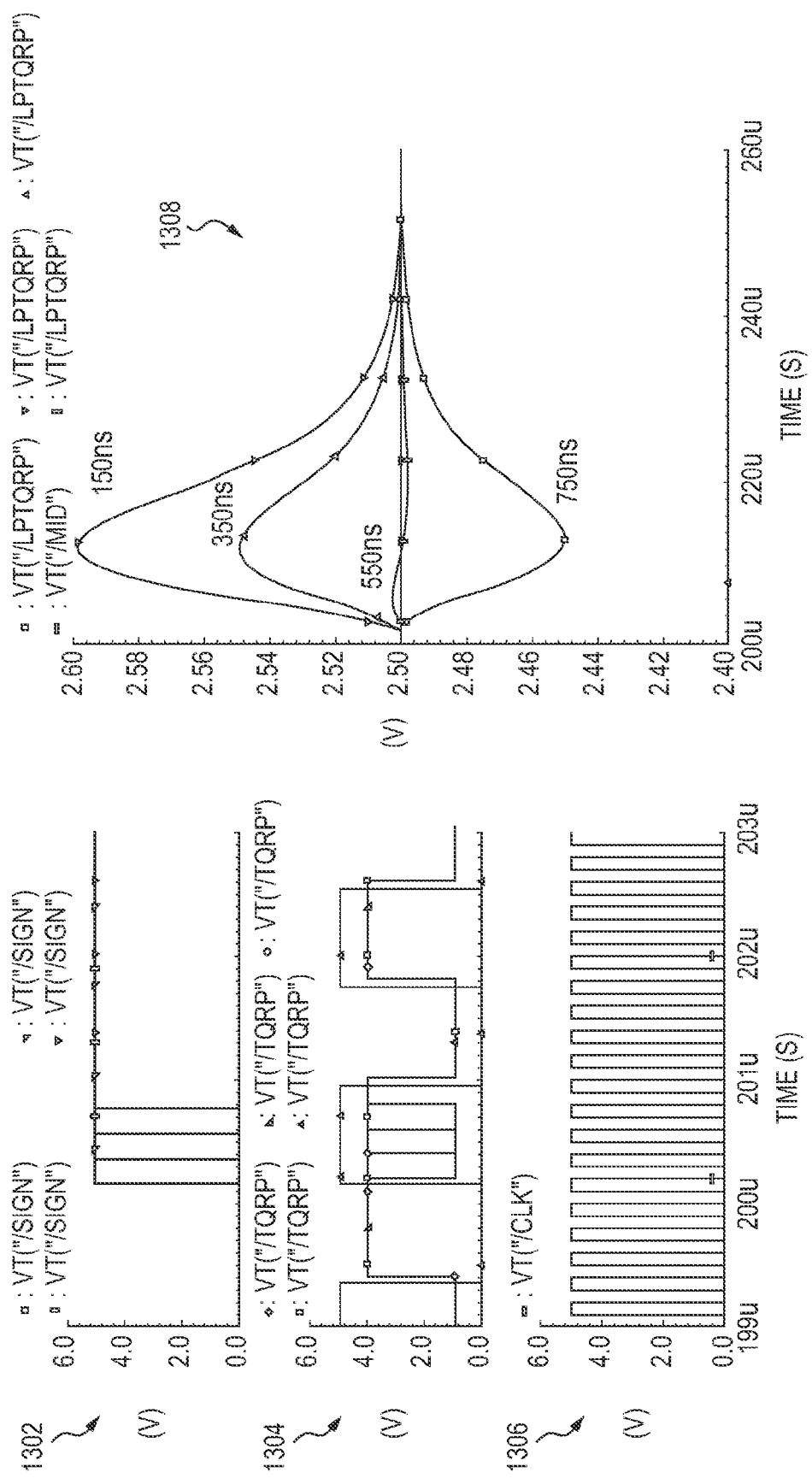
FIGS. 13a and 13b include graphs depicting the results of various simulations, according to examples.

To further confirm the relationship between the sign-bit-pulse amplitude and phase relationship between the data waveform 202 and signum function 204, additional simulations were conducted. The results of these additional simulations are reproduced FIGS. 13a and 13b. FIG. 13a includes graphs 1302,1304,1306,1308 depicting plots of signum functions that are shifted by 0, 1, 2, and 3 clock cycles, a data waveform, a clock signal, and resultant voltage outputs, respectively. Note that the plots of the signum functions, data waveform, and clock signal shown in graphs 1302, 1304, and 1306, respectively, are drawn at a different time scale than the plots of the voltage outputs shown in graph 1308.

Figure 13B:
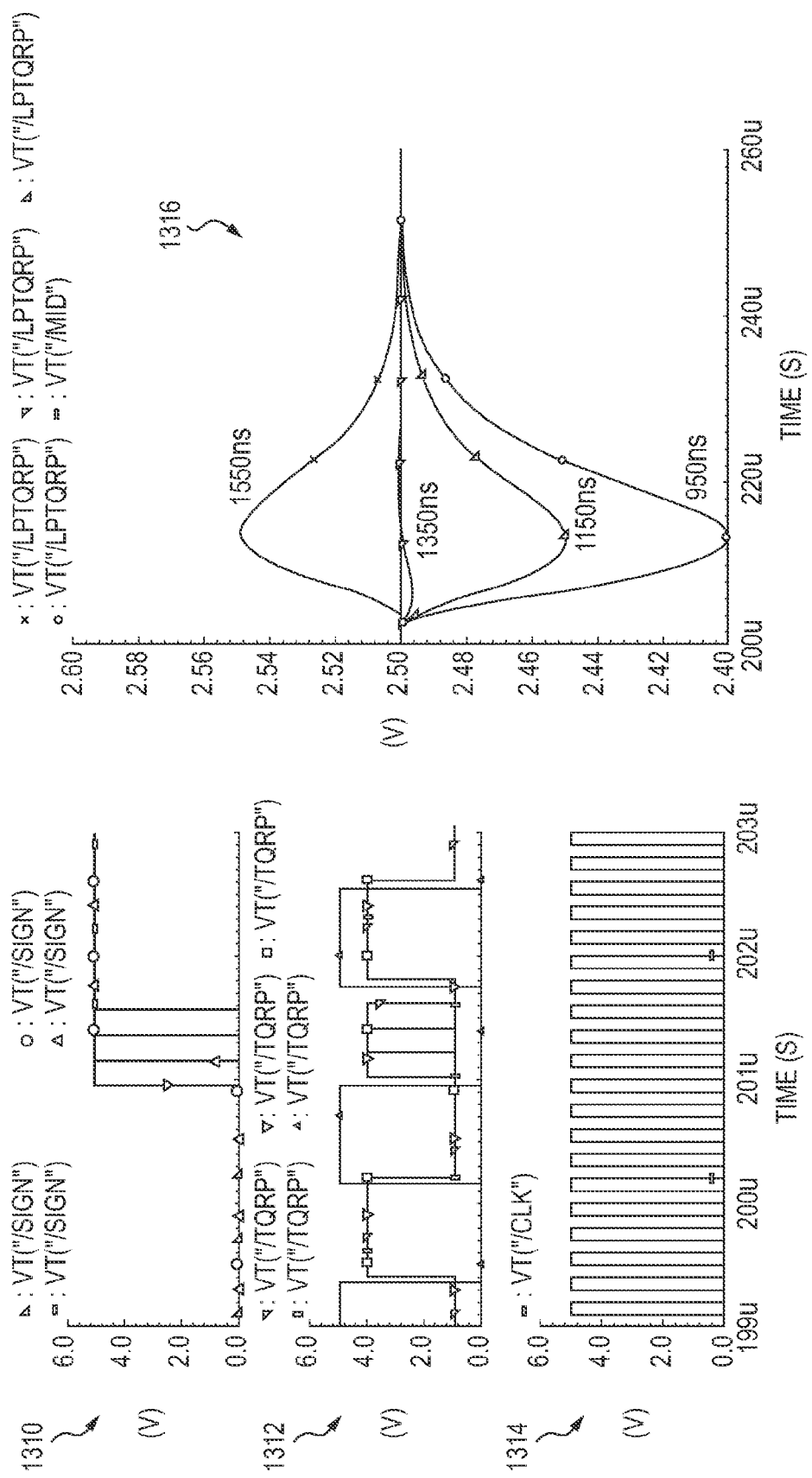

And FIG. 13b includes graphs 1310,1312,1314,1316 depicting plots of signum functions that are shifted by 4, 5, 6, and 7 clock cycles, a data waveform, a clock signal, and resultant voltage outputs, respectively. Note that the plots of the signum functions, data waveform, and clock signal shown in graphs 1310, 1312, and 1314, respectively, are drawn at a different time scale than the plots of the voltage outputs shown in graph 1316. And to magnify the amplitude of the observed plots of the voltage outputs, the data waveform changes states on every fourth clock cycle, rather than every single clock cycle.

Figure 14:
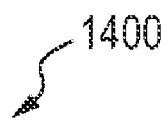
FIG. 14 is a data table summarizing the results of the various simulations of FIGS. 13a and 13b.

The data from FIGS. 13a and 13b are summarized in data table 1400 of FIG. 14. The data table 1400 indicates that the sign-bit-pulse amplitude is a linear function of the phase relationship between the data waveform 202 and signum function 204. In particular, the data table 1400 indicates that by setting the phase relationship between the data waveform 202 and signum function 204 such that the data waveform 202 and signum function 204 are out of phase by approximately 90°, the amplitude of the sign-bit pulse is reduced by a factor of approximately 28. These simulations suggest that it is possible to reduce the amplitude of the sign-bit pulse to zero by fine tuning the phase relationship between the data waveform 202 and signum function 204.

Figure 15:
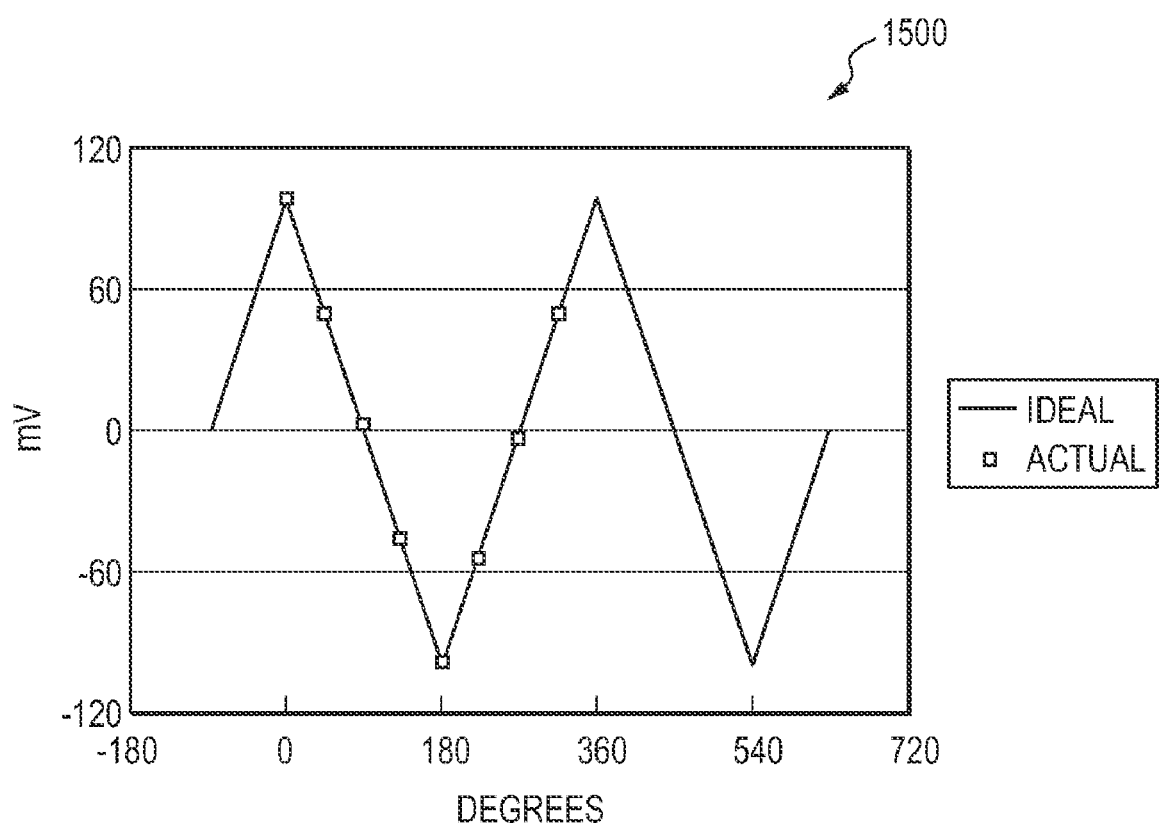
FIG. 15 is a graph depicting sign-bit-pulse amplitude as a function of a phase relationship between first and second waveforms, according to an example.

The data table 1400 is plotted against a triangle-wave function in graph 1500 of FIG. 15, where zero degrees of phase shift is defined as the point where the positive-rising edge of the signum function 204 aligns with the positive-rising edge of the data waveform 202. The graph 1500 shows that the sign-bit pulse reaches a maximum amplitude at integer multiples of 180° degrees of phase shift. Further, the sign-bit pulse reaches a minimum amplitude at approximately 90° degrees (93.3° to be precise) and at integer multiples of 180° degrees of phase shift from 90° degrees. Hence, the triangle-wave function of graph 1500 indicates that by setting the phase relationship between the data waveform 202 and signum function 204 such that the two are out of phase by approximately 90° (e.g., between 80° and 100°) plus or minus an integer multiple of 180°, the amplitude of the sign-bit pulse may be significantly reduced.

3. System Architecture

The above frequency-domain analyses and simulations suggests a method of significantly reducing the sign-bit pulse at a voltage output of an SD DAC: before multiplying the data waveform and signum function 204, set the phase relationship between the data waveform 202 and signum function 204 such that they are out of phase by (i) approximately 90° (e.g., between 80° and 100°) plus or minus an integer multiple of 180° and/or (ii) one-half of a data period (one-fourth of a clock) period before multiplying the waveforms. More generally, the sign-bit-pulse amplitude may be significantly reduced by aligning at least one of the data waveform 202 and signum function 204 such that a transition of the signum function 204 occurs half way between a rising edge and adjacent falling edge of the data waveform 202.

Figure 16:
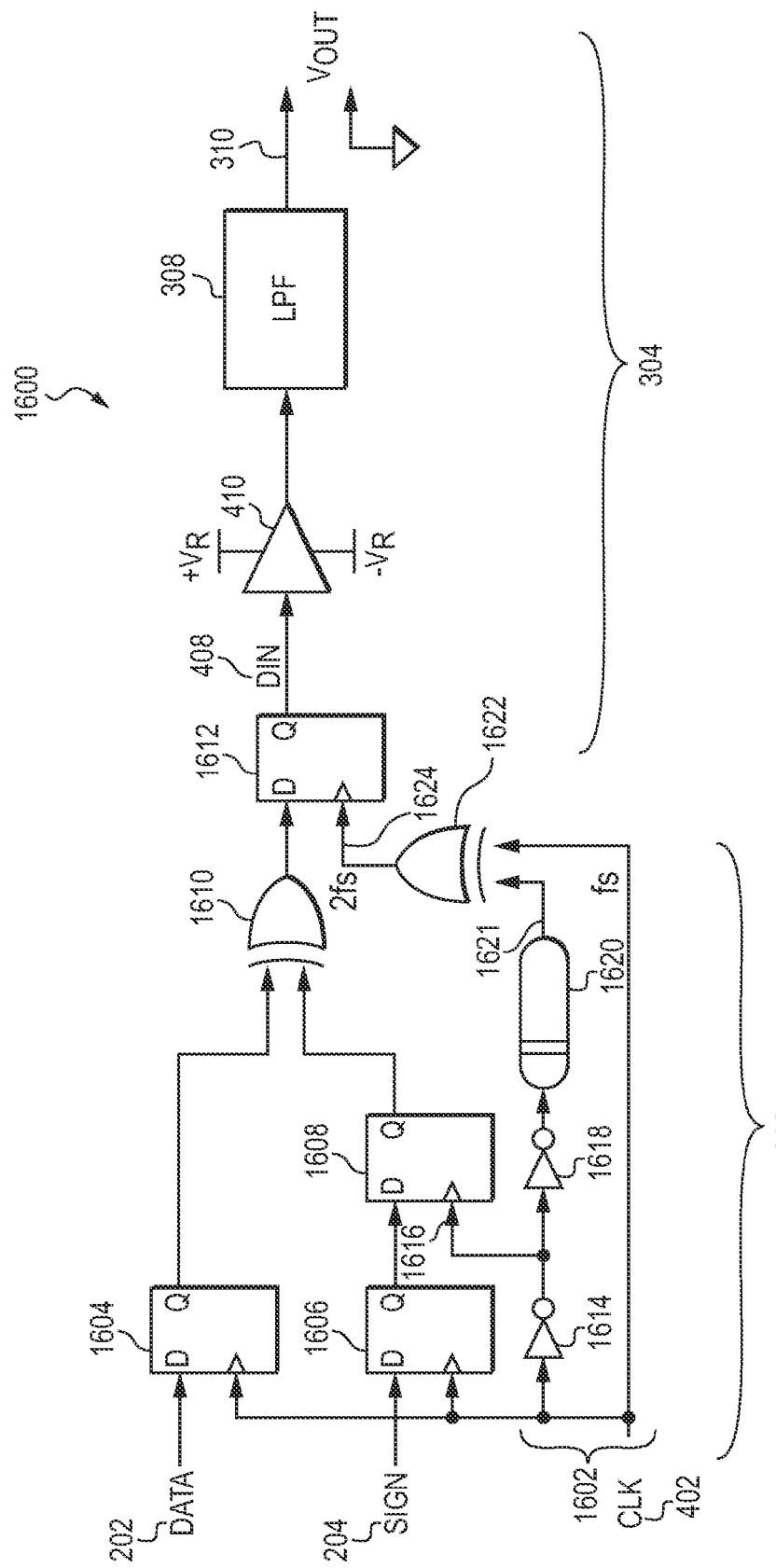
FIG. 16 is a block diagram of a circuit for use in producing a voltage output, according to an example.

The phase relationship between the data waveform 202 and signum function 204 may be set in any of a variety of ways. FIG. 16 is a block diagram of a circuit 1600 for use in setting a phase relationship between the data waveform 202 and signum function 204, according to an example. As shown in FIG. 16, the circuit 1600 includes the multiplier 302 and SD DAC 304. The multiplier 302 includes flip-flops 1604,1606, 1608,1612, exclusive-OR gates 1610 and 1622, inverters 1614 and 1618, and delay line 1620. The multiplier 302 may include clock-adjusting circuitry 1602, which may include inverters 1614 and 1618, delay line 1620, and exclusive-OR gate 1622. The SD DAC 304 includes the digital input 408, digital translator 410, LPF 308, and voltage output 310.

It should be understood that this and other arrangements described herein are set forth only as examples Those skilled in the art will appreciate that other arrangements and elements (e.g., machines, interfaces, functions, orders, and groupings of functions, etc.) can be used instead. Further, many of the elements described herein are functional entities that may be implemented as discrete or distributed components or in conjunction with other components, and in any suitable combination and location, Various functions described herein as being performed by one or more entities may be carried out by hardware, firmware, and/or software. And various functions may be carried out by a processor executing instructions stored in memory.

In operation, the flip-flops 1604 and 1606 are clocked by the clock signal 402. In this example, the clock signal 402 has a digital-clock frequency, $f_S$, and has a 50% duty cycle. Of course, other examples exist for the clock signal 402. For example, the clock signal 402 may have a duty cycle other than 50%. As another example, rather than a single clock signal, the flip-flops 1604 and 1606 may be clocked by first and second clock signals. If first and second clock signals are used to clock the flip-flops 1604 and 1606, the period of the first clock signal preferably equals the period of the second clock signal, and the first and second clocks signals are preferably in phase with one another.

As shown in FIG. 16, the flip-flop 1604 receives the data waveform 202 and the flip-flop 1606 receives the signum function 204. Since the flip-flops 1604 and 1606 are clocked by the same clock signal (or by the first and second clock signals as described above), the output of flip-flop 1604 (i.e., the data waveform 202) and the output of flip-flop 1606 (i.e., the signum function 204) are in phase with each other. As an example, the data waveform 202 and signum function 204 may each make a positive transition at a rising edge of the clock signal 402 (e.g., at t=0).

As shown, the input of flip-flop 1608 is connected to the output of the flip-flop 1606, and the flip-flop 1608 is clocked by a clock signal 1616. Preferably, the clock signal 1616 is approximately 180° out of phase with the clock signal 402. Since the clock signal 402 has a 50% duty cycle, the clock signal 1616 may be produced by investing the clock signal 402 via the inverter 1614. Of course, rather than inverting the clock signal 402, the clock signal 1616 may be produced by a separate, third clock signal. If produced by a third clock signal, the period of the third clock signal is preferably equal to the period of the clock signal 402, and the third clock signal is preferably out of phase with the clock signal 402 (e.g., by approximately 180°).

On the other hand, if the clock signal 402 has a duty cycle other than 50%, the clock signal 1616 may be produced by using a delay line, phase-locked loop, or delay-locked loop techniques.

Since the clock signal 1616 is approximately 180° out of phase with the clock signal 402, the output of flip-flop 1608 includes the signum function 204 that is delayed by one-fourth of a data cycle. Therefore, the output of the flip-flop 1608 (i.e., the signum function 204) is one-half of a clock cycle or approximately 90° out of phase with the output of the flip-flop 1604 (i.e., the data waveform 202).

The exclusive-OR gate 1610 receives as inputs the output of flip-flops 1604 and 1608. Since the output of the flip-flop 1608 (i.e., the signum function 204) is one-half of a clock cycle or approximately 90° out of phase with the output of the flip-flop 1604 (i.e., the data waveform 202), the output of the exclusive-OR gate 1610 is a digital waveform similar to that of digital waveforms 902 and 1102.

The output of the exclusive-OR gate 1610 is connected to the input of the flip-flop 1612. Since the flip-flops 1604, 1606, and 1608 cooperatively set the phase relationship between the data waveform 202 and signum function 204 such that the waveforms are out of phase by approximately 90° plus or minus an integer multiple of 180°, for example, the output of the flip-flop 1612 includes a digital waveform that is substantially similar to the digital waveforms 902 and 1102.

As shown, the flip-flop 1612 is clocked by a clock signal 1624, which has a digital-clock frequency, $2f_S$, which is twice the digital-clock frequency of the clock signal 402, $f_S$. Preferably, the clock signal 1624 is in phase with the clock signal 402. Clocking the flip-flop 1612 by the clock signal 1624, which has a digital-clock frequency that is twice the digital-clock frequency of the clock signal 402, preferably ensures that potential glitches produced at the output of the exclusive-OR gate 1610 do not propagate to the SD DAC 304.

The clock signal 1624 may be produced in any of a variety of ways. For systems that do not have a clock signal with a 50% duty cycle (i.e., a clock signal that includes a square waveform), a frequency doubler or phase-locked loop oscillator may be used to generate a clock signal that has a digital-clock frequency of $2f_S$. On the other hand, for systems having clock signal with a 50% duty cycle, a clock signal with a digital-clock frequency of $2f_S$ may be generated by taking the exclusive-OR (erg, using the exclusive-OR gate 1612) of the clock signal 402 and a delayed version of the clock signal 402 (i.e., clock signal 1624).

The clock signal 1624 (i.e., the delayed version of the clock signal 402) may be produced in any of a variety of ways. As an example, the clock signal 1624 may be produced by connecting the clock signal 402 to one or more pairs of inverters, such as inverters 1614 and 1618, and/or a delay line 1620. The clock signal 1624 may be produced by delaying the clock signal 402 by 25%, as an example.

The delay line 1620 may take any of a variety of configurations. As an example, the delay line 1620 may include an RLC network. As another example, the delay line 1620 may include a transmission line.

Alternatively, the clock signal 1624 may be a fourth, separate clock signal. Preferably, the fourth clock signal is in phase with the clock signal 402 and includes a digital-clock frequency that is twice the digital-clock frequency of the clock signal 402. Of course, other examples exist for the clock signal 1624.

The output of the flip-flop 1612 includes the digital input 408, and is connected to the digital translator 410. Since the digital input 408 includes a digital waveform substantially similar to the digital waveform 902 and 1102, the voltage output 310 of the SD DAC 304 preferably does not include a sign-bit pulse, or includes a sign-bit pulse with a significantly reduced amplitude as compared to the plot 508, for example.

Figure 17:
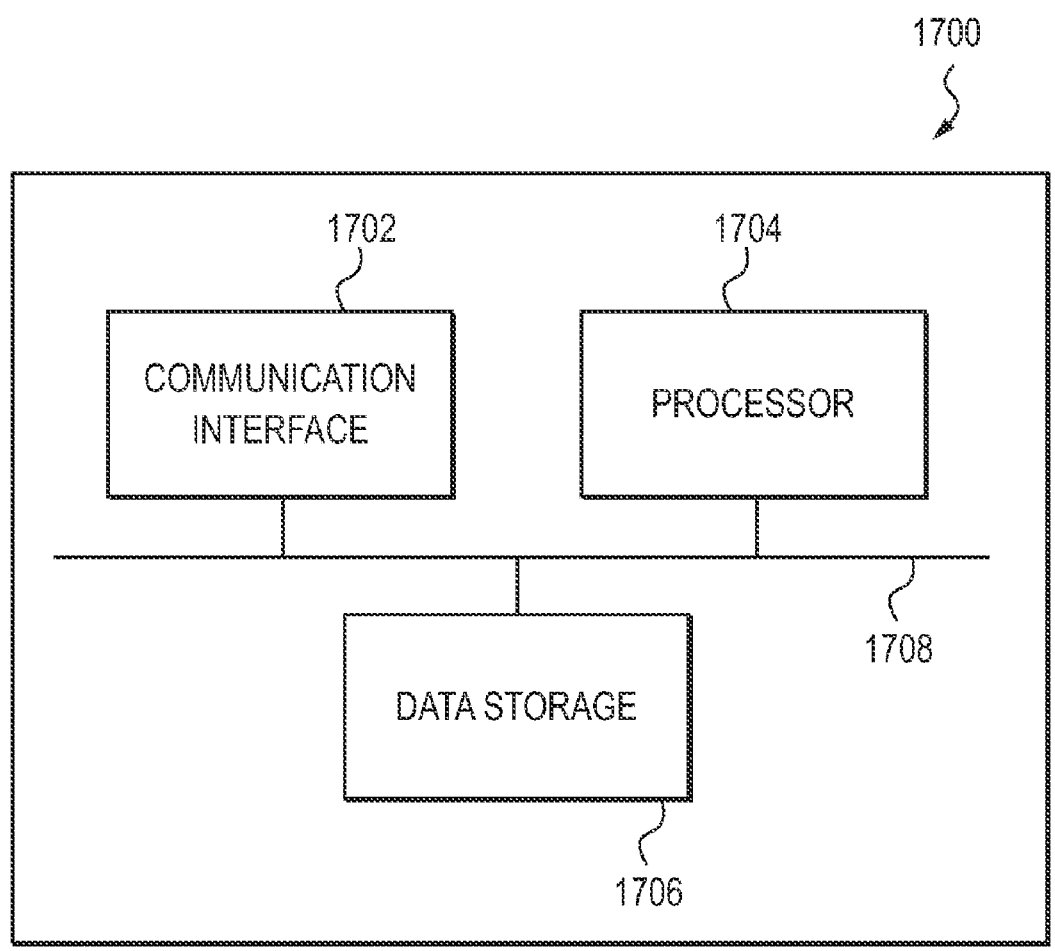
FIG. 17 is a block diagram of a system, according to an example.

Of course, the phase relationship between the data waveform 202 and signum function 204 may be set in other ways. FIG. 17 is a block diagram of a system 1700. As an example, the system 1700 may be used to set the phase relationship between the data waveform 202 and signum function 204. As another example, the system 1700 may be used to provide the data waveform 202 and signum function 204 such that a transition of the signum function 204 is aligned approximately half way between a rising edge and adjacent falling edge of the data waveform 202.

As shown, the system 1700 includes a communication interface 1702, processor 1704, and data storage (or memory) 1706, all linked together, via a system bus, network, or other connection mechanism 1708. It should be understood that this and other arrangements described herein are set forth only as examples Those skilled in the alt will appreciate that other arrangements and elements (e.g., machines, interfaces, functions, orders, and groupings of functions, etc.) can be used instead. Further, many of the elements described herein are functional entities that may be implemented as discrete or distributed components or in conjunction with other components, and in any suitable combination and location. Various functions described herein as being performed by one or more entities may be carried out by hardware, firmware, and/or software.

The communication interface 1702 provides an interface for communications between other portions of the system 1700 and one or more other entities, devices, and systems. The communication interface 1702 may take any of a variety of configurations.

The processor 1704 may include one or more processors (e.g., one or more general-purpose processors and/or one or more specialized processors). The processor 1704 is arranged to carry out functions described herein, and may do so by executing computer-readable program instructions stored in data storage 1706 and/or in firmware. In response to executing the program instructions, the processor 1704 may interact with the communication interface 1702 and/or connection mechanism 1708 so as to carry out functions described herein.

Data storage 1706 may take any of a variety of configurations. For example, data storage 1706 may include a computer-readable medium. The computer-readable medium may include volatile and/or non-volatile storage components, such as optical, magnetic, organic, flash, or other memory or disc storage, The computer-readable medium of data storage 1706 may be integrated in whole or in part with the processor 1704.

Further, data storage 1706 may store various types of data. For instance, data storable in data storage 1706 may be arranged as program instructions executable by the processor 1704. As examples, program instructions executable by the processor 1704 may include instructions to: (i) provide the data waveform 202 and signum function 204 such that a transition of the signum function is aligned approximately half way between a rising edge and adjacent falling edge of the data waveform 202; (ii) align at least one of the data waveform 202 and signum function 204 such that a transition (positive or negative) of the signum function 204 is approximately half way between a rising edge and adjacent failing edge of the data waveform 202; (iii) set the phase relationship between the data waveform 202 and signum function 204 such that the data waveform 202 and signum function 204 are out of phase by approximately 90° (e.g., between 80° and 100°) plus or minus an integer multiple of 180°; (iv) set the phase relationship between the data waveform 202 and signum function 204 such that the first and second waveforms are one-fourth of a clock cycle out of phase from one another; and (v) multiply the data waveform 202 and signum function 204 to produce a digital input. Of course, other examples of program instructions stored in data storage 1706 executable by processor 1704 are also possible. Further, other examples exist for the system 1700.

In the above examples, the length of the data pattern presented to the SD DAC 304 is 2 (e.g., 01). For longer data patterns (e.g., 0011) that have an even-numbered pattern length, the sign-bit pulse may be significantly reduced by similarly setting the phase relationship between the data waveform 202 and signum function 204 such that the waveforms are out of phase by approximately 90° plus or minus an integer multiple of 180°. More generally, the sign-bit-pulse amplitude may be significantly reduced by setting the phase relationship between the data waveform 202 and signum function 204 such that the signum function 204 makes a positive or negative transition approximately half way between a rising edge and consecutive falling edge of the data waveform 202.

For even-numbered data patterns that are longer than 2, the data presented to the SD DAC 304 is preferably clocked at a frequency of $2f_S$. Further, for any even-pattern length, n, the multiplier 302 may include a counter having n states and a 2n-bit long shift register. Additionally, for very large values of n (e.g., 1024), a processor may algorithmically generate the data presented to the digital input 408, rather than digital logic such as the multiplier 302.

4. First Methodology a. Overview

Figure 18:
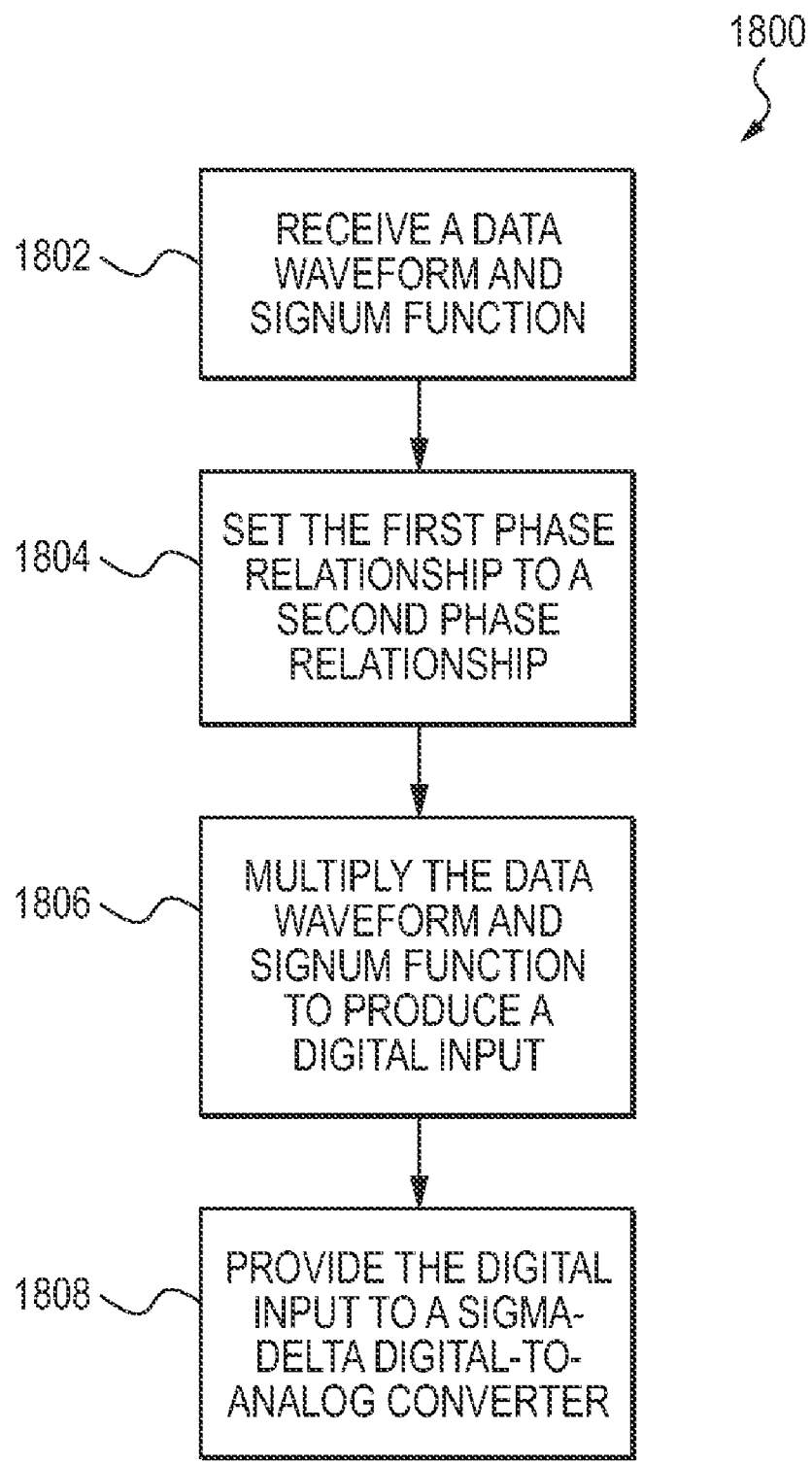
FIG. 18 is a flow chart provided to illustrate some of the functions that may be carried out in accordance with an embodiment of the present invention.

FIG. 18 is a flow chart of a method 1800 for reducing a sign-bit pulse at a voltage output of an SD DAC. Two or more of the functions shown in FIG. 18 may occur substantially simultaneously.

At block 1802, the method includes receiving a data waveform and a signum function, the data waveform and signum function having a first phase relationship. At block 1804, the method includes setting the first phase relationship between the data waveform and signum function to a second phase relationship. At block 1806, upon setting the second phase relationship between the data waveform and signum function, the method includes multiplying the data waveform and signum function to produce a digital input. And at block 1808, the method includes providing the digital input to an SD DAC.

b. Method Steps i. Receiving a Data Waveform and Signum Function

At block 1802, the method includes receiving a data waveform and a signum function. The data waveform and signum function may take any of a variety of forms. As examples, the data waveform may include a square waveform and the signum function may include a unit-step function. The data waveform may include a plurality of rising edges and falling edges. Of course, other examples exist for the data waveform and signum function.

The data waveform and signum function have a first phase relationship. As an example, the data waveform and signum function may be in phase with one another. Of course, other examples exist for the first phase relationship.

Receiving the data waveform and signum function may take any of a variety of configurations. As an example, receiving the data waveform and signum function may include providing the data waveform to a first flip-flop to produce a first output and providing the signum function to a second flip-flop to produce a second output. The first flip-flop may be clock by a first clock signal and the second flip-flop may be clocked by a second clock signal. The period of the first clock signal is preferably equal to the period of the second clock signal, and the first clock signal is preferably in phase with the second clock signal. Alternatively, rather than first and second clocks, a single clock may be used to clock the first and second flip-flops. Of course, other examples exist for the receiving the data waveform and signum function.

ii. Set a First Phase Relationship to a Second Phase Relationship

At block 1804, the method includes setting the first phase relationship between the data waveform and signum function to a second phase relationship. The first phase relationship between the data waveform and signum function may be set to the second phase relationship in any of a variety of ways. In an example, setting the second phase relationship may include aligning at least one of the data waveform and signum function such that a transition (positive or negative) of the signum function is approximately half way between a rising edge and adjacent falling edge of the data waveform.

In one example, setting the second phase relationship may include adjusting at least one of the data waveform and signum function such that the data waveform and signum function are out of phase by approximately 90° (e.g., between 80° and 100°) plus or minus an integer multiple of 180°. In another example, setting the second phase relationship may include adjusting at least one of the data waveform and signum function such that the data waveform and signum function are out of phase by one-fourth of a data cycle.

Any combination of hardware, software, and firmware may be used to set the first phase relationship between the data waveform and signum function to the second phase relationship. In one instance, setting the first phase relationship between the data waveform and signum function to the second phase relationship includes providing the second output to a third flip-flop to produce a third output. The third flip-flop may be clocked by a third clock signal. The period of the third clock signal is preferably equal to the period of at least one of the first clock signal and the second clock signal. Further, the third clock signal is preferably out of phase with at least one of the first clock signal and second clock signal (e.g., 90° out of phase with at least one of the first clock signal and second clock signal), If the first or second clock signal is a square waveform (i.e., a duty cycle of 50%), then the third clock signal may be produced by inverting the first or second clock signal.

In another instance, the system 1700 may set the first phase relationship between the data waveform and signum function to the second phase relationship. More generally, a processor (e.g., DSP) executing programs stored in memory may set the first phase relationship between the data waveform and signum function to the second phase relationship. Of course, other examples exist for setting the first phase relationship between the data waveform and signum function to the second phase relationship.

iii. Multiplying the Data Waveform and Signum Function to Produce a Digital Input At block 1806, upon setting the second phase relationship between the data waveform and signum function, the method includes multiplying the data waveform and signum function to produce a digital input.

Any combination of hardware, software, and firmware may be used to multiply the data waveform and signum function. As an example, the system 1700 may multiply the data waveform and signum function. More generally, a processor (e.g., DSP) executing program instructions stored in memory may multiply the data waveform and signum function. As another example, an exclusive-OR gate may multiply the data waveform and signum function.

In the case where the first, second, and third flip-flops are used, multiplying the data waveform and signum function may include multiplying the first output and the third output to produce a fourth output. Of course, other examples exist for multiplying the data waveform and signum function to produce the digital input.

iv. Providing the Digital Input to an SD) DAC

At block 1808, the method includes providing the digital input to an SD DAC, If first, second, and third flip-flops are used as described above, providing the digital input to the SD DAC may include providing the fourth output to a fourth flip-flop that produces the digital input. The fourth flip-flop may be clocked by a fourth clock signal that is in phase with at least one of the first clock signal and second clock signal, and has a digital-clock frequency that is twice the digital clock frequency of at least one of the first clock signal and second clock signal.

The fourth clock signal may be produced in any of a variety of ways. As an example, a frequency doubler or phase-locked loop oscillator may be used to produce the fourth clock signal.

As yet another example, the fourth clock signal may be produced by delaying the first clock signal to produce a delayed first clock signal, and taking the exclusive-OR of the first clock signal and the delayed first clock signal. As another example, the fourth clock signal may be produced by delaying the second clock signal to produce a delayed second clock signal, and taking the exclusive-OR of the second clock signal and the delayed second clock signal.

Delaying the first or second clock signal may take any of a variety of configurations. As an example, delaying the first or second clock signal may include providing the first or second clock signal to a series of one or more pairs of inverters and/or a delay line. The delay line may take any of a variety of configurations, such as an RLC network (e.g., RLC network 1702 or 1704) and a transmission line. Of course, other examples and combinations exist for delaying the first or second clock signal and for producing the fourth clock signal.

5. Second Methodology a. Overview

Figure 19:
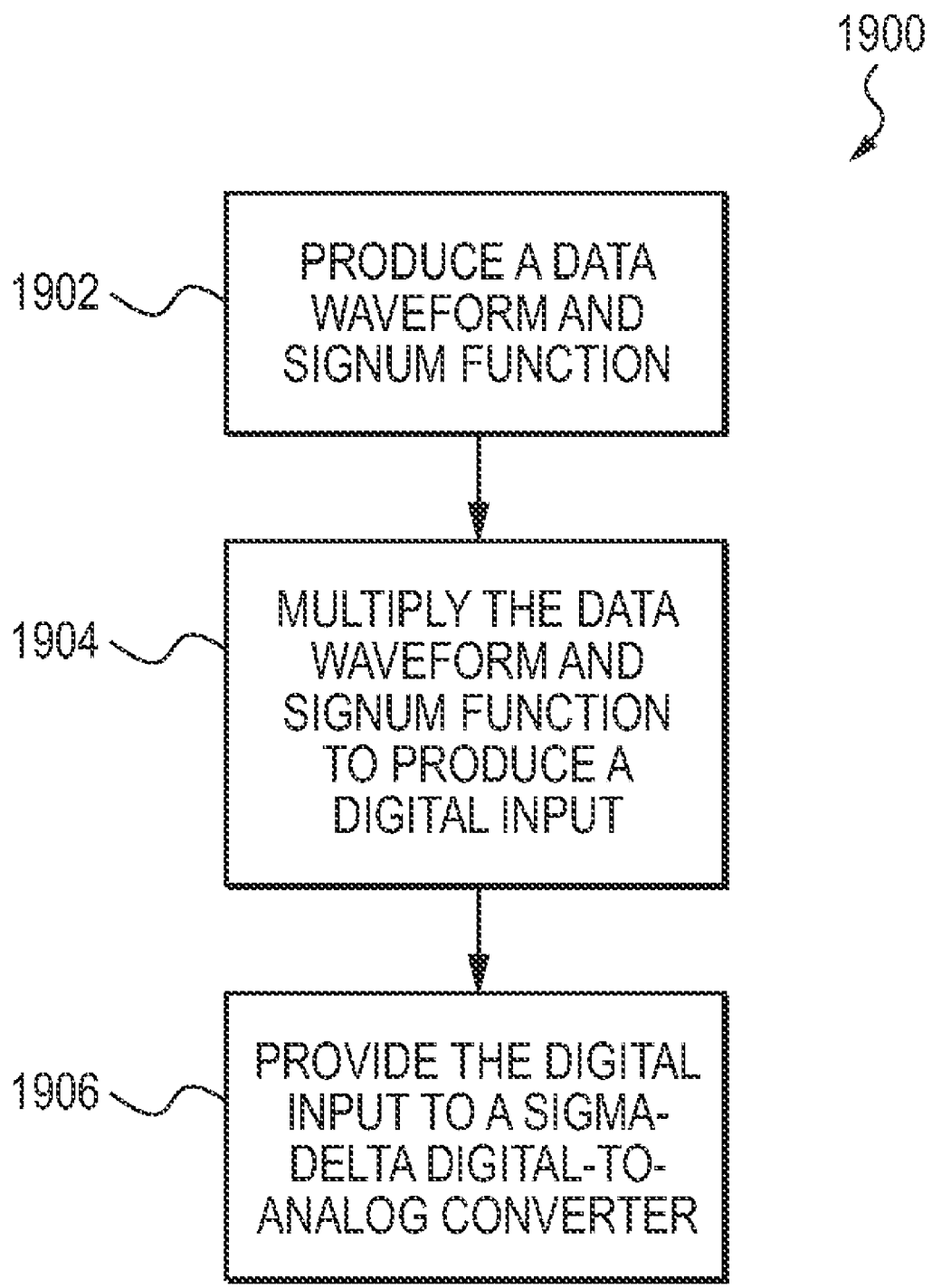
FIG. 19 is a flow chart provided to illustrate some of the functions that may be carried out in accordance with an embodiment of the present invention.

FIG. 19 is a flow chart of a method 1900 for reducing a sign-bit pulse at a voltage output of an SD DAC. Two or more of the functions shown in FIG. 19 may occur substantially simultaneously.

At block 1902, the method includes providing a data waveform and signum function such that a transition of the signum function is aligned approximately half way between a rising edge and adjacent falling edge of the data waveform. At block 1904, the method includes multiplying the first and second waveforms to produce a digital input. At block 1906, the method includes providing the digital input to the SD DAC.

b. Method Steps i. Providing a Data Waveform and Signum Function

At block 1902, the method includes providing a data waveform and signum function such that a transition of the signum function is aligned approximately half way between a rising edge and adjacent falling edge of the data waveform (i.e., the data waveform and signum function have a given phase relationship). Providing the data waveform and signum function with the given phase relationship may take any of a variety of configurations, Any combination of hardware, software, and firmware may be used to provide the data waveform and signum function with the given phase relationship. For example, the system 1700 may be used to provide the data waveform and signum function with the given phase relationship. More generally, a processor executing program instructions stored in memory may provide the data waveform and signum function with the given phase relationship. Providing the data waveform and signum function with the given phase relationship may include providing the data waveform and signum function with a phase relationship other than the given phase relationship, and setting the phase relationship between the two from the other phase relationship to the given phase relationship. Any combination of hardware (e.g., flip-flops 1604, 1606, and 1608), software, and firmware may be used to set the phase relationship between the data waveform and signum function from the other phase relationship to the given phase relationship. For examples the system 1700 may be used to set the phase relationship between the data waveform and signum function from the other phase relationship to the given phase relationship. More generally, a processor executing program instructions stored in memory may set the phase relationship between the data waveform and signum function from the other phase relationship to the given phase relationship.

The given phase relationship between the data waveform and signum function may take any of a variety of configurations. For example, the given phase relationship may include the data waveform and signum function being out of of phase by 90° (e.g., between 80° and 100°) plus or minus an integer multiple of 180°. As another example, the given phase relationship may include the data waveform and signum function being one-half of a clock cycle out of phase from one another. Of course, other examples exist for the given phase relationship. Further, other examples exist for providing the data waveform and signum function such that a transition of the signum function is aligned approximately half way between a rising edge and adjacent falling edge of the data waveform.

ii. Multiplying the Data Waveform and Signum Function to Produce a Digital Input At block 1904, the method includes multiplying the data waveform and signum function to produce a digital input. Multiplying the data waveform and signum function may be substantially similar to the method step at block 1806 iii. Providing the Digital Input to an SD DAC

At block 1906, the method includes providing the digital input to the SD DAC. Providing the digital input to the SD DAC may be substantially similar to the method step at block 1808

6. Conclusion

For an SD DAC that includes a voltage output and a low-pass filter having a given order, methods and systems for reducing a sign-bit pulse at the voltage output of the SD DAC without requiring use of a higher order low-pass filter have been disclosed. By adjusting or setting the phase relationship between the data waveform and signum function, one may significantly reduce the amplitude of a sign-bit pulse at the voltage output of the SD DAC.

Exemplary embodiments of the present invention have been described above, Those skilled in the art will understand, however, that changes and modifications may be made to the embodiments described without departing from the true scope and spirit of the present invention, which is defined by the claims.

I claim:

1. For a sigma-delta digital-to-analog converter that includes a voltage output and a low-pass filter having a given order, a method for reducing a sign-bit pulse at the voltage output of the sigma-delta digital-to-analog converter without requiring use of a higher order low-pass filter, the method comprising:

receiving a first waveform and a second waveform, the first and second waveforms having a first phase relationship, wherein the first waveform comprises a plurality of rising edges and falling edges;

setting the first phase relationship between the first and second waveforms to a second phase relationship, wherein setting the first phase relationship to the second phase relationship comprises aligning at least one of the first and second waveforms such that a transition of the second waveform is approximately half way between a rising edge and adjacent falling edge of the first waveform;

upon setting the second phase relationship between the first and second waveforms, multiplying the first and second waveforms to produce a digital input; and providing the digital input to the sigma-delta digital-to-analog converter.

2. The method of claim 1, wherein the first and second waveforms having the first phase relationship comprises the first and second waveforms being in phase with one another.

3. The method of claim 1, wherein the first waveform includes a square waveform and the second waveform includes a sign function.

4. The method of claim 1, wherein setting the first phase relationship between the first and second waveforms to the second phase relationship comprises adjusting at least one of the first and second waveforms such that the first and second waveforms are out of phase by approximately 90° plus or minus an integer multiple of 180°.

5. The method of claim 1, wherein setting the first phase relationship between the first and second waveforms to the second phase relationship comprises adjusting at least one of the first and second waveforms such that the first and second waveforms are one-fourth of a data cycle out of phase from one another.

6. The method of claim 1, wherein receiving the first and second waveforms comprises:
providing the first waveform to a first flip-flop to produce a first output, wherein the first flip-flop is clocked by a first clock signal; and
providing the second waveform to a second flip-flop to produce a second output, wherein the second flip-flop is clocked by a second clock signal, wherein a period of the first clock signal is equal to a period of the second clock signal, and wherein the first clock signal is in phase with the second clock signal.

7. The method of claim 6, wherein the first clock signal comprises the second clock signal.

8. The method of claim 6, wherein setting the first phase relationship between the first and second waveforms to the second phase relationship comprises providing the second output to a third flip-flop to produce a third output, wherein the third flip-flop is clocked by a third clock signal, wherein a period of the third clock signal is equal to the period of at least one of the first clock signal and the second clock signal, and wherein the third clock signal is out of phase with at least one of the first clock signal and second clock signal.

9. The method of claim 8, wherein the third clock signal is approximately 180° out of phase with at least one of the first clock signal and second clock signal.

10. The method of claim 8, wherein the third clock signal is produced by inverting one of the first clock signal and second clock signal.

11. The method of claim 8, wherein multiplying the first and second waveforms comprises multiplying the first output and the third output to produce a fourth output.

12. The method of claim 11, wherein multiplying the first output and the third output comprises taking an exclusive-OR of the first output and third output.

13. The method of claim 11, wherein providing the digital input to the sigma-delta digital-to-analog converter comprises providing the fourth output to a fourth flip-flop that produces the digital input.

14. The method of claim 13, wherein the fourth flip-flop is clocked by a fourth clock signal that is in phase with at least one of the first clock signal and second clock signal, and wherein a frequency of the fourth clock signal is approximately twice a frequency of at least one of the first clock signal and second clock signal.

15. The method of claim 13, wherein the fourth clock signal is produced by at least one of: (i) delaying the first clock signal to produce a delayed first clock signal, and taking an exclusive-OR of the first clock signal and the delayed first clock signal; and (ii) delaying the second clock signal to produce a delayed second clock signal, and taking an exclusive-OR of the second clock signal and the delayed second clock signal.

16. For a sigma-delta digital-to-analog converter that includes a voltage output and a low-pass filter of a given order, a system for reducing a sign-bit pulse at the voltage output of the sigma-delta digital-to-analog converter without requiring use of a higher order low-pass filter, the system comprising a multiplier, wherein the multiplier is arranged to:
receive a first waveform and a second waveform, the first and second waveforms having a first phase relationship, wherein the first waveform comprises a plurality of rising edges and falling edges;
set the first phase relationship between the first and second waveforms to a second phase relationship, wherein the multiplier aligns at least one of the first and second waveforms such that a transition of the second waveform is approximately half way between a rising edge and adjacent falling edge of the first waveform;
upon setting the second phase relationship between the first and second waveforms, multiply the first and second waveforms to produce a digital input; and
provide the digital input to the sigma-delta digital-to-analog converter.

17. The system of claim 16, wherein the multiplier adjusts at least one of the first and second waveforms such that the first and second waveforms are out of phase by approximately 90° plus or minus an integer multiple of 180°.

18. The system of claim 16, wherein the multiplier adjusts at least one of the first and second waveforms such that the first and second waveforms are one-fourth of a data cycle out of phase from one another.

19. For a sigma-delta digital-to-analog converter that includes a voltage output and a low-pass filter having a given order, a method for reducing a sign-bit pulse at the voltage output of the sigma-delta digital-to-analog converter without requiring use of a higher order low-pass filter, the method comprising:
providing a first waveform and a second waveform such that a transition of the second waveform is aligned approximately half way between a rising edge and adjacent falling edge of the first waveform;
multiplying the first and second waveforms to produce a digital input; and
providing the digital input to the sigma-delta digital-to-analog converter.

20. The method of claim 19, wherein providing the first waveform and the second waveform comprises a processor executing program instructions that are stored in memory to provide the first waveform and the second waveform.

* * * * *